United States Patent
Sel et al.

(10) Patent No.: US 8,558,283 B2
(45) Date of Patent: Oct. 15, 2013

(54) SEMICONDUCTOR DEVICE INCLUDING DUMMY

(75) Inventors: Jong-sun Sel, Hwaseong-si (KR); Nam-su Lim, Hwaseong-si (KR); In-wook Oh, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 158 days.

(21) Appl. No.: 12/794,809

(22) Filed: Jun. 7, 2010

(65) Prior Publication Data

US 2011/0001243 A1 Jan. 6, 2011

(30) Foreign Application Priority Data

Jul. 1, 2009 (KR) .................. 10-2009-0059764

(51) Int. Cl.
*H01L 23/48* (2006.01)
(52) U.S. Cl.
USPC ........... 257/211; 257/390; 257/773; 257/210; 257/758; 257/506; 257/501; 257/E23.011
(58) Field of Classification Search
USPC .......... 257/773, E23.011, 390, 211, 210, 758, 257/506, 501
See application file for complete search history.

(56) References Cited

U.S. PATENT DOCUMENTS

| 2004/0157442 A1* | 8/2004 | Cowley et al. ................. 438/687 |
| 2007/0120260 A1* | 5/2007 | Kitabayashi et al. ......... 257/758 |
| 2009/0072322 A1* | 3/2009 | Lee et al. ....................... 257/390 |

FOREIGN PATENT DOCUMENTS

| KR | 1020060075971 A | 7/2006 |
| KR | 100645721 B1 | 11/2006 |
| KR | 1020070074954 A | 7/2007 |

* cited by examiner

*Primary Examiner* — S. V. Clark
*Assistant Examiner* — Krista Soderholm
(74) *Attorney, Agent, or Firm* — Volentine & Whitt, PLLC

(57) ABSTRACT

A semiconductor device or a memory which includes the same have a line pattern, and a contact plug, the line pattern including a first linear feature to which the contact plug is connected by design, and a second linear feature having a connecting portion and a dummy portion adjacent the location at which the contact plug is electrically connected to the first linear feature. A second contact plug is electrically connected to the connecting portion of the second linear feature of the line pattern. In the case of a misalignment error or the like, the first contact plug may also be electrically connected to the second linear feature of the line pattern but at the dummy portion thereof so as to not create a short circuit in that case. The dummy portion thus allows a sufficiently large process margin to be secured for the contact plug.

12 Claims, 21 Drawing Sheets

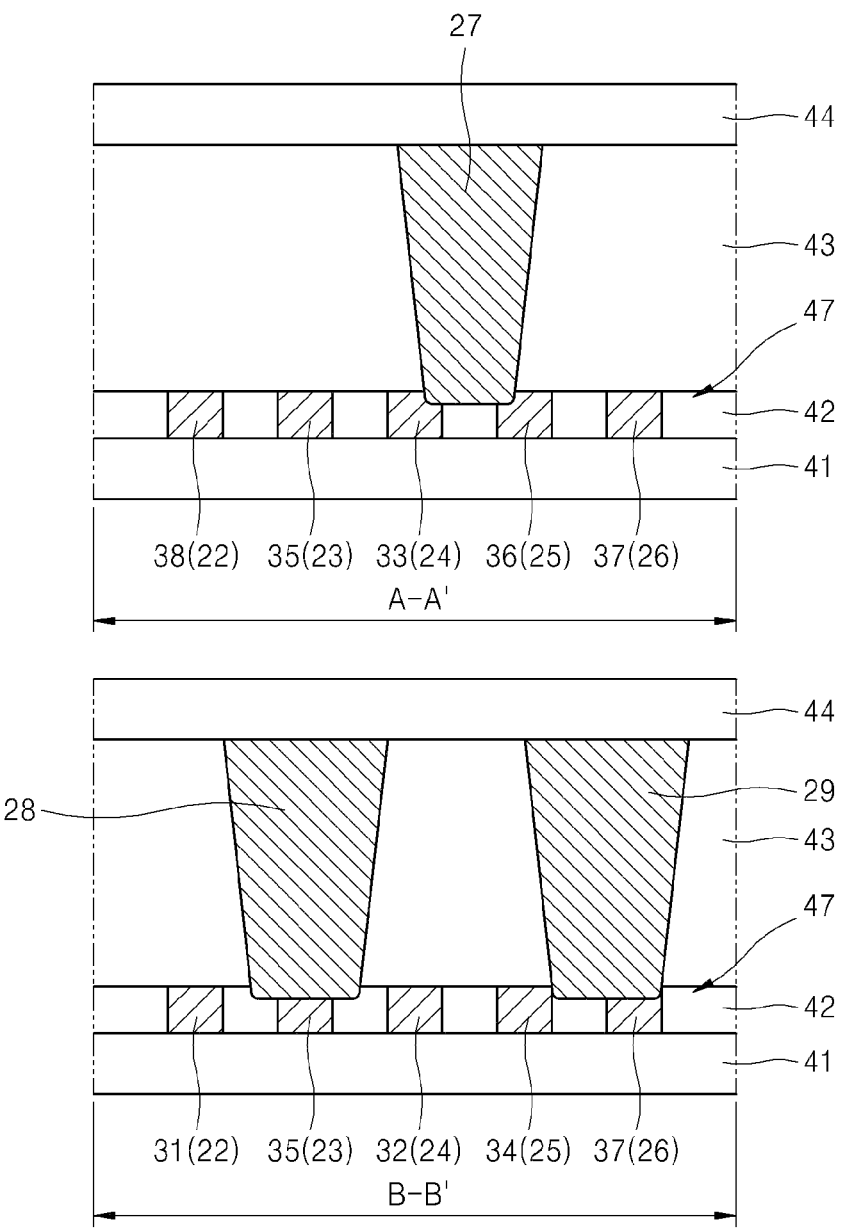

FIG. 3B
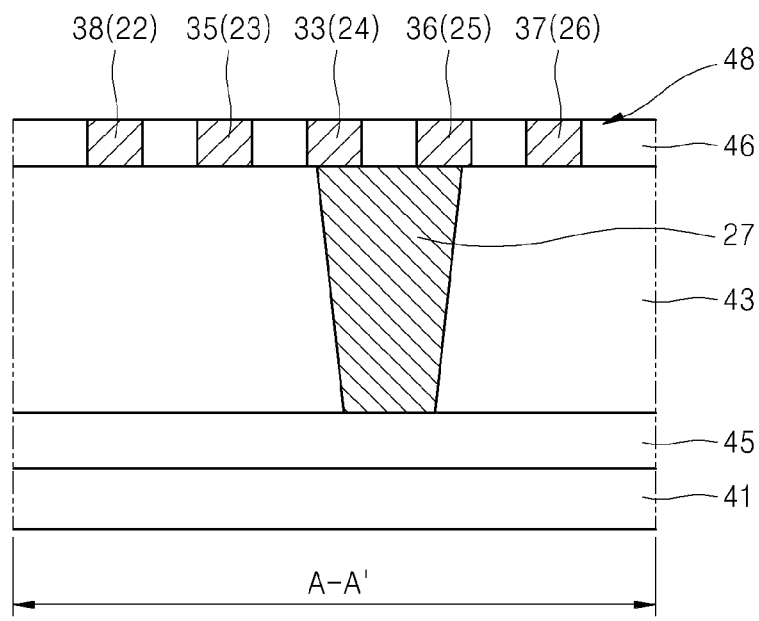
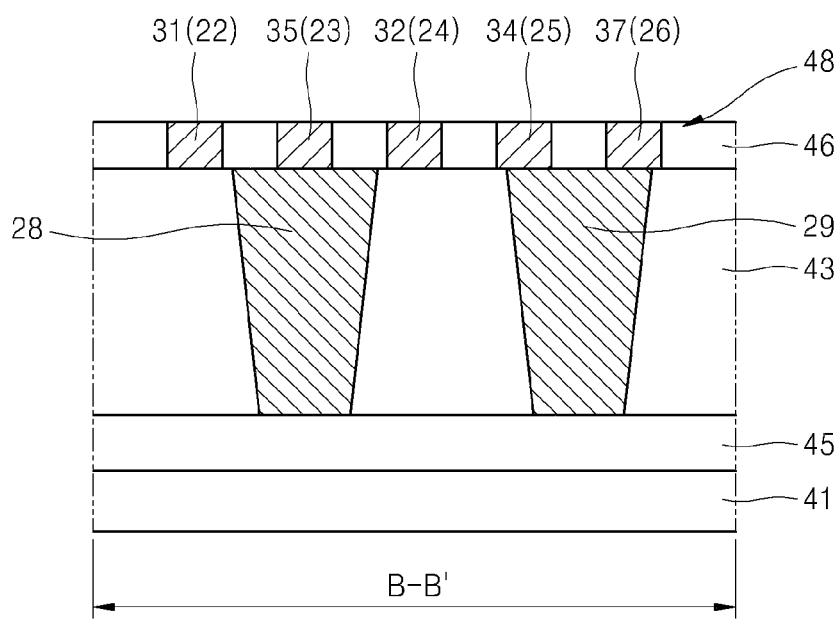

SEMICONDUCTOR DEVICE INCLUDING DUMMY

PRIORITY STATEMENT

This application claims the benefit of Korean Patent Application No. 10-2009-0059764, filed on Jul. 1, 2009, in the Korean Intellectual Property Office.

BACKGROUND

The inventive concept relates to a semiconductor device. More particularly, the inventive concept relates to a semiconductor device having a line pattern and contact plugs formed thereon.

Semiconductor devices are increasingly becoming more and more integrated, i.e., the design rules of semiconductor devices is decreasing. Therefore, the manufacturing of such semiconductor devices must ensure a sufficiently large process margin. For example, the design rules have evolved to be equal to or less than 40 nm. However, a single photo/etch patterning method, which is the technique typically used to form various patterns of semiconductor devices, does not ensure a sufficiently great process margin in the case of a pattern having a line width equal to or less than 40 nm. In particular, the conventional photolithography process of the method has limits with respect to the fineness of the pattern which it can be used to form.

However, recently, a double patterning technique employing a sidewall spacer has made it is possible to form a pattern, in particular, a line/space wiring pattern, having a line width equal to or less than 40 nm. In a device whose line pattern has a line width equal to or less than 40 nm, the diameter (critical dimension) of the contact holes must also be equal to or less than 40 nm. However, neither a single photo/etch patterning technique nor the double patterning technique can be adopted to form a contact hole having a diameter equal to or less than 40 nm. Rather, such a contact hole can only be formed via high-performance photolithography. Even so, a sufficiently large process margin can not be ensured.

SUMMARY

According to an aspect of the inventive concept, there is provided a semiconductor device comprising a line pattern including a first linear feature extending longitudinally in a first direction, and a second linear feature extending longitudinally in the first direction as spaced from the first linear feature in a second direction and comprising a connecting portion and a dummy portion electrically insulated from each other and having the same width, a first contact plug electrically connected to the first linear feature of the line pattern at a location adjacent the dummy portion of the second line pattern, and a second contact plug electrically connected to the connecting portion of the second linear feature of the line pattern.

According to another aspect of the inventive concept, there is provided a semiconductor device comprising a lower layer having a plurality of linear active regions and a plurality of linear isolation regions, wherein the plurality of active regions and the plurality of isolation regions each extend longitudinally in a first direction, and the active regions are alternately disposed with the isolation regions across a semiconductor substrate, an insulating layer disposed on the lower layer, and contact plugs each extending through the insulating layer.

The active regions include a first active region, and a second active region that is spaced from the first active region in a second direction and comprises a dummy portion and a connecting portion which are electrically insulated from each other and have the same width. The contact plugs include a first contact plug adjacent the dummy portion of the second active region and electrically connected to the first active region, and a second contact plug electrically connected to the connecting portion of the second active region.

According to another aspect of the inventive concept, there is provided a semiconductor device comprising memory transistors disposed at an upper portion of the substrate, an insulating layer disposed on the semiconductor substrate, contact plugs each extending through the insulating layer, and a wiring layer comprising a line pattern of a plurality of linear conductive lines and an insulating pattern of a plurality of linear segments of insulating material, wherein the conductive lines of the line pattern and the segments of the insulating pattern each extend longitudinally in a first direction, the conductive lines are alternately disposed in a second direction across the substrate with the segments of the insulating pattern, the linear conductive lines of the line pattern include a first line and a second line that is separated from the first line and comprises a dummy portion and a connecting portion which are electrically insulated from each other and have the same width, and the contact plugs include a first contact plug adjacent to the dummy portion of the second line and electrically connected to the first line, and a second contact plug electrically connected to the connecting portion of the second line.

BRIEF DESCRIPTION OF THE DRAWINGS

The inventive concept will be more clearly understood from the following detailed description of embodiments thereof taken in conjunction with the accompanying drawings in which:

FIG. 3A is a pair of cross-sectional views taken along lines A-A' and B-B' of FIG. 2A;

FIG. 3B is a similar pair of cross-sectional views but of another embodiment according to the inventive concept;

FIGS. 6 and 7 are layout diagrams of portions of a memory cell array or arrays, each according to the inventive concept, employed by a non-volatile memory of the type depicted by FIG. 5, wherein FIG. 6 illustrates an example of the connection between active regions and bit line contact plugs, and FIG. 7 illustrates an example of the connection between bit line contact plugs of a memory cell string and bit lines;

DETAILED DESCRIPTION OF THE PREFERRED EMBODIMENTS

Figure 1A:
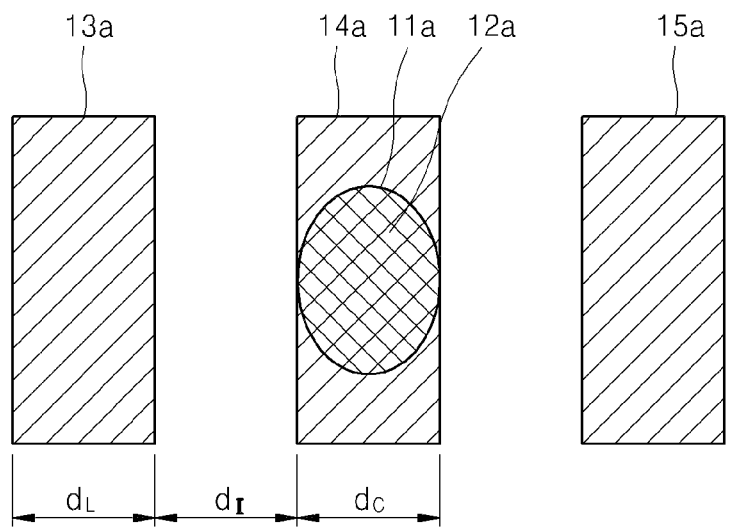
FIGS. 1A through 1E are each a horizontal cross-sectional view of a contact plug formed on a line pattern according to related art.

The inventive concept will now be described more fully hereinafter with reference to the accompanying drawings. In the drawings, the thicknesses of layers and regions may be exaggerated for clarity. Also, like reference numbers are used to designate like elements, etc. throughout the drawings.

It will also be understood that when an element or layer is described in the specification as being "on" another element or layer, such a description refers to both a case in which the element or layer is disposed directly on the another element or layer or the case in which other elements or layers are interposed therebetween. Furthermore, the term "substantially" is used to encompass obvious tolerances such as those inherent in any manufacturing process. The term "electrically connecting" or "electrically connected to" includes both a case in which the electrically conductive components in question contact one another so as to be directly electrically connected to each other or the case in which electrically conductive components are electrically connected to each via at least one other electrically conductive element interposed therebetween. Also, terms such as "upper" and the like are used herein for ease in describing one element or feature's relationship to another element(s) or feature(s) as illustrated in the figures. It will thus be understood that such terms are spacially relative terms and may thus describe the orientation of one element or feature relative to another element(s) or feature(s) in an actual device which, when in use, is oriented differently from that shown in the drawings, e.g., is inverted with respect to the orientation shown in the drawings.

First, contact plugs formed on line patterns according to a related art will be described with reference to FIGS. 1A-1E.

Referring to FIG. 1A, a contact plug 12a is formed on one 14a of several lines 13a through 15a constituting a line and space pattern (merely referred to as a 'line pattern' hereinafter). The line pattern is formed using a single photo/etch patterning method, and has a relatively large line width $d_L$ and a relatively large spacing or pitch $d_I$. The contact plug 12a is of conductive material that fills a contact hole 11a having a diameter (critical dimension) $d_C$ substantially equal to or less than the line width $d_L$. The contact hole 11a may also be formed using a single photo/etch patterning method because, as illustrated in FIG. 1A, the diameter $d_C$ of the contact hole 11a is relatively large. However, a semiconductor device including a line pattern having such a relatively large line width $d_L$ and pitch $d_I$, and a contact plug 12a occupying such a relatively large area can not be highly integrated.

Figure 1B:
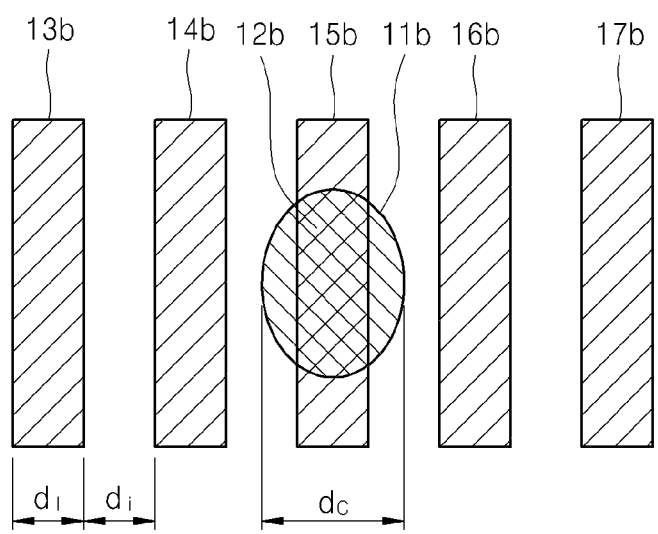
Figure 1C:
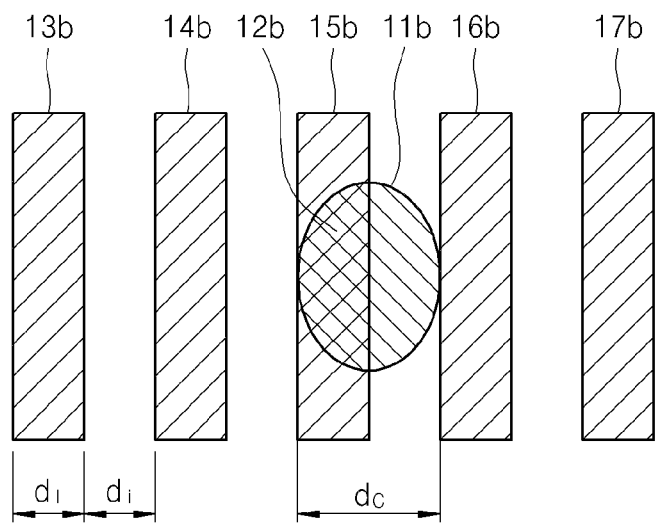

FIG. 1B also shows a contact plug 12b formed on one 15b of several linear features 13b through 17b constituting a line pattern. (Hereinafter, the linear features forming the lines of a line and space pattern will be referred to as 'lines'.) The line pattern has a relatively small line width $d_I$, i.e., in comparison to the line width $d_L$ of the line pattern of FIG. 1A, and thus, it is difficult to manufacture the lines 13b through 17b using the single photo/etch patterning method. In this case, the line patterns 13b through 17b may be formed using a double patterning technique using a sidewall spacer, which will be described in detail later. After a contact hole 11b having a diameter $d_C$ is formed using a single photo/etch patterning technique, the contact hole 11b is filled with conductive material to form the contact plug 12b. However, in this case, it is difficult to assure a sufficiently large process margin for the contact plug 12b, whose diameter $d_C$ is relatively large compared to the line width $d_I$ of the line pattern, due to the lines patterns 14b and 16b adjacent to that 15b on which the contact plug 12b is to be formed. Also, the contact plug 12b is formed without confirming the exact location of the line 15b because an insulating layer (not shown) through which the contact hole 11b is formed exists on the line pattern. Accordingly, as illustrated in FIG. 1C, the contact plug 12b may be electrically connected to not only the desired the line 15b but also electrically connected to an adjacent line (e.g., the line 16b), thereby creating a defect in the semiconductor device.

Figure 1D:
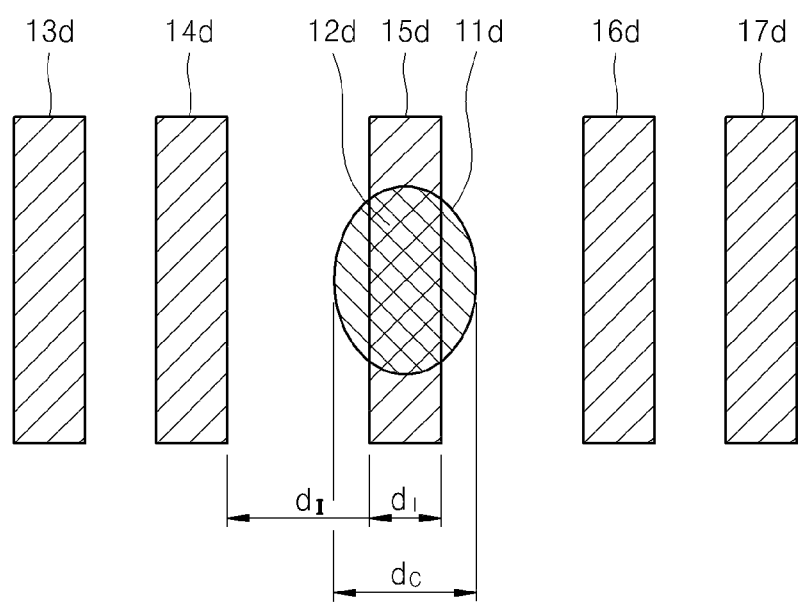

Referring to FIG. 1D, the line pattern has a an irregular spacing in which the spaces $d_I$ between one line 15d and each of the adjacent lines 14d and 16d are relatively wide so as to ensure a sufficiently large process for the contact plug 12d to be formed on the line 15d. However, this layout is problematic in that the irregular spacing arbitrarily requires the layout of bit-lines or active regions of a memory cell of the semiconductor device to be adjusted in conformance therewith. In some cases, it might not be possible to form a memory cell array that conforms to the irregular spacing of the line pattern.

Figure 1E:
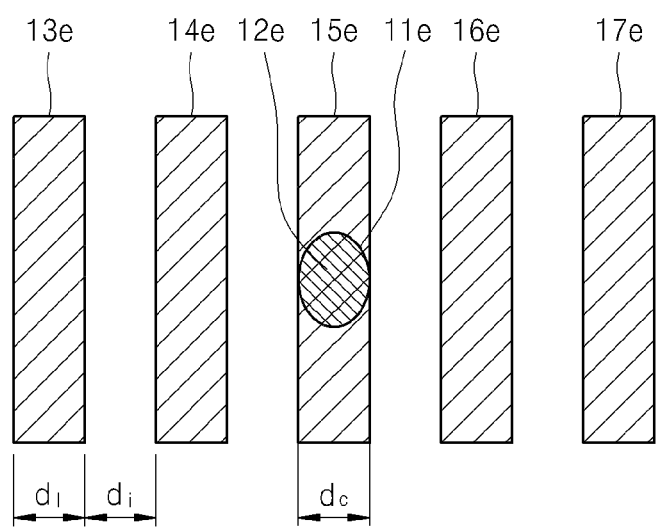

Referring to FIG. 1E, a contact plug 12e is formed on one 15e of several lines 13e through 17e constituting a line pattern having a small line width $d_I$. The diameter $d_c$ of the contact plug 12e is substantially equal to or less than the line width $d_I$. According to such a design, a sufficiently large process margin is ensured for the contact plug 12e, and the semiconductor device may have a high degree of integration. However, it is difficult to form such a contact hole 11e, i.e., a contact hole having small diameter, using the same double patterning technique required to form the lines 13e through 17e. Instead, the contact hole 11e must be formed using high-performance photolithography which adds high costs to the overall manufacturing process.

Figure 2A:
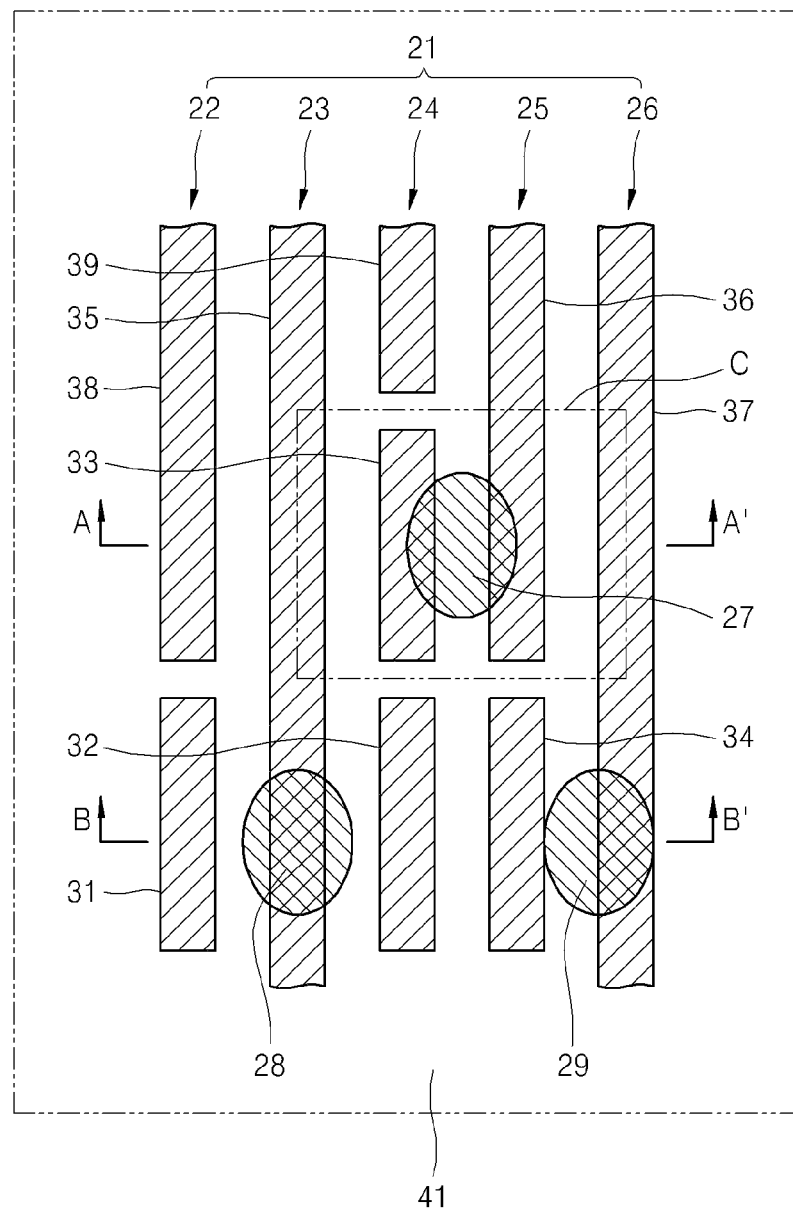
FIG. 2A is a horizontal cross-sectional view of a semiconductor device including contact plugs and a line pattern, according to the inventive concept, and illustrating various examples of how a sufficient process margin is secured for a contact plug according to the inventive concept.
Figure 2B:
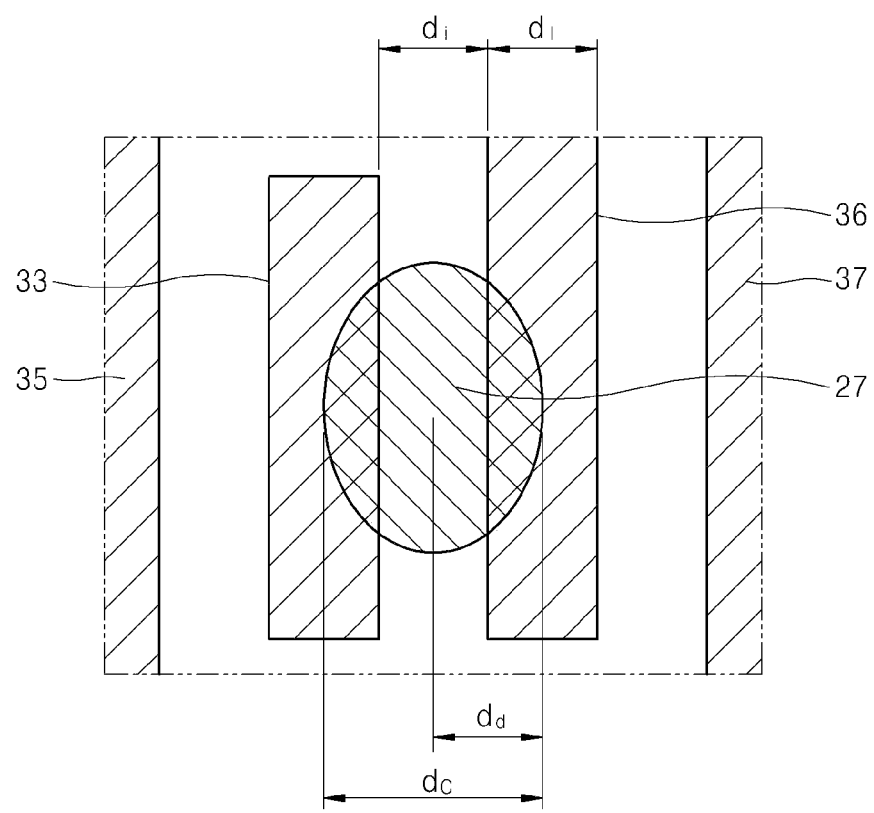
FIG. 2B is an enlarged view of region "C" of FIG. 2A.

FIGS. 2A and 2B illustrate a semiconductor device including a line pattern and a contact plug, according to the inventive concept.

Referring to FIG. 2A, a line pattern 21 includes a semiconductor substrate 41, a line pattern 21, i.e., a plurality of linear features 22 through 26 (referred to hereinafter merely as 'lines' 22 through 26), and contact plugs 27 through 29.

The semiconductor substrate 41 may be a silicon substrate, a silicon on insulator (SOI) substrate, a Ga—As substrate, a silicon germanium substrate, a ceramic substrate, a quartz substrate, or a glass-for-display substrate. Unit devices (not shown) that are required to form various types of active devices or passive devices which are necessary for the semiconductor device may be disposed on the semiconductor substrate 41. Also, the semiconductor device may have isolation layers (not shown) that isolate the unit devices. The isolation layers may be formed using a local oxidation of silicon (LOCOS) process or a shallow trench isolation (STI) process. Still further, an interlayer dielectric layer (not shown) may cover the unit devices. Also, conductive regions (not shown) that are to be electrically connected to the unit devices via the interlayer dielectric layer may be formed on the semiconductor substrate 41. In addition, conductive lines (not shown) for connecting each of the unit devices or each of the conductive regions may be formed on the semiconductor substrate 41.

In any case, in this embodiment, the plurality of lines 22 through 26 of the line pattern each extend longitudinally in a first direction so as to be parallel, and each have a width $d_l$. Also, the line pattern 21 has a regular spacing or pitch such that the lines 22 through 26 are spaced from each other by equal intervals $d_i$ in a second direction perpendicular to the first direction. Also, insulating material occupies the regions between the lines 22 through 26 so as to electrically insulate each of the lines 22 through 26.

The line pattern 21 may be an interlayer wiring layer and, in particular, lines 22 through 26 may each be a bit line. Alternatively, the lines 22 through 26 may be active regions that are defined by isolation regions (not shown). Such various forms of the lines 22 through 26 will be described in more detail later on.

The lines 22 through 26 are made up of dummy portions 31 through 34 and connecting portions 35 through 37. More specifically, the dummy portions 31 through 34 may be directly and electrically connected to the contact plugs 27 through 29 but are electrically insulated from all other elements. On the other hand, the connecting portions 35 through 37 are each electrically connected to the contact plugs 27 through 29, respectively.

FIG. 2A shows the lines 22 and 24 constituting the line pattern 21 as also having portions 38 and 39. These portions 38 and 39 of the lines 22 and 24 may be respectively electrically connected to other contact plugs not shown in FIG. 2A. In this case, the portions 38 and 39 of the lines 22 and 24 are connecting portions. Alternatively, the portions 38 and 39 may be dummy portions.

The semiconductor device also has insulating material occupying regions between the dummy portions 31 through 34, the connecting portions 35 through 37 and the portions 38 and 39 of the lines 22 through 26 so as to electrically insulate the dummy portions 31 through 34, the connecting portions 35 through 37 and the portions 38 and 39 from each other.

Note, the dummy portions 31 through 34 and the connecting portions 35 through 37 are discrete elements or regions, as shown in FIG. 2A. However, the dummy portion 34 and the connecting portion 36, for example, are colinear. Moreover, as will be described later on, the dummy portion 34 and the connecting portion 36 are formed contemporaneously and in the same plane using a double patterning technique. Thus, both the dummy portion 34 and the connecting portion 36 can be said to constitute a line, namely line 25, of the line pattern 21.

The semiconductor device illustrated in FIGS. 2A and 2B will now be described in more detail.

As described above, the line 26 and the contact plug 29 are to be electrically connected to one another as part of the layout of the semiconductor device. The dummy portion 34, as part of the line 25 adjacent that to which the contact plug 29 is to be electrically connected by design, is provided adjacent the location at which the contact plug 29 is electrically connected to the line 26. In this case, the contact plug 29 inadvertently contacts the dummy portion 34 in such a manner that the contact plug 29 is electrically connected to the dummy portion 34 in addition to the line 26. Nonetheless, a sufficient process margin is secured for the contact plug 29 even though the contact plug is misaligned with the line 26 to such an extent that it contacts the adjacent line 25. Furthermore, and although not illustrated in FIG. 2A, even if a line were to extend in the first direction to the right of the line 26, a dummy portion of such a line would be formed adjacent the location at which the contact plug 29 is electrically connected to the line 26 so that a sufficiently large process margin would still be ensured for the contact plug 29.

The contact plug 27 is to electrically connected to the line 25 as by design. More specifically, the contact plug 27 is electrically connected to the connecting portion 36 of the line 25. Also, a dummy portion 33 of the adjacent line 24 is provided adjacent the location at which the contact plug 27 is electrically connected to the line 25. In this case, the contact plug 27 is so misaligned with respect to the line 25 that part of the contact plug 27 is inadvertently vertically juxtaposed with and hence, is electrically connected to the adjacent line 24. However, because the contact plug 27 is juxtaposed with the dummy portion 33 of the line 24, a sufficient process margin is nonetheless secured for the contact plug 27.

Referring to FIG. 2B, an example will be described in which the line width $d_l$ of the line pattern 21 and the spacing $d_i$ are equal to each other and are equal to or less than 40 nm. The value of 40 nm is used to exemplify the upper limit of critical dimensions which can not be produced using a single photo/etch patterning technique.

In this example, the diameter $d_C$ of the contact plug 27 is greater than the line width $d_l$ of each of the lines 24 and 25; however, in a semiconductor device according to the inventive concept, the diameter $d_C$ may be smaller than or the same as the line width $d_l$. The central axis of the contact plug 27 is offset from the longitudinal center line of the line 25 towards the dummy portion 33 by a distance $d_d$. For example, the central axis of the contact plug 27 may wind up midway between the line patterns 24 and 25. Therefore, in a case in which the line pattern 21 has a uniform line width $d_l$ of 30 nm and a uniform line spacing or pitch $d_i$ of 30 nm, and the contact plug 27 has a diameter $d_C$ of 80 nm, if the central axis of the contact plug 27 is positioned at the center between the line patterns 24 and 25, the contact plug 27 has a process margin of 35 nm with respect to the connecting portions 35 and 37 closest to the line 25 in the second direction (to the left and right in FIGS. 2A and 2B). Such a large process margin ensures that a reliable semiconductor device may be manufactured according to the inventive concept. In contrast, if the related art of FIG. 1B were to have corresponding dimensions, a process margin of only 5 nm can be secured, meaning that an undesired electrical short is likely to occur between adjacent lines. Moreover, because a semiconductor device according to the inventive concept may employ contact plugs having a diameter (critical dimension) of 80 nm, a single photo/etch patterning technique may be used to form the contact plugs and hence, manufacturing costs may be kept to a minimum.

Referring back to FIG. 2A, the contact plug 28 is electrically connected to the line 23 and more specifically, to the connecting portion 35 of the line 23, by design. Dummy portions 31 and 32 are provided at both sides of the location at which the connecting portion 35 and the contact plug 28 are electrically connected to each other. In this example of the connection between a contact plug and a line, the contact plug 28 is well-aligned with the line 23 and so, is not electrically connected to the dummy portions 31 and 32. Nonetheless, the dummy portions 31 and 32 ensure that the contact plug 28 has a large process margin. Using the numerical values above, a process margin of 65 nm is secured for the contact plug 28 with respect to adjacent lines 22 and 24.

FIGS. 3A and 3B are each a pair of cross-sectional views of a respective embodiment of a semiconductor device of FIG. 2A, taken along lines A-A' and B-B'. FIG. 3A illustrates an embodiment in which the contact plugs are formed above the line pattern, and FIG. 3B illustrates an embodiment in which contact plugs are formed below the line pattern.

Referring to FIGS. 2A and 3A, the semiconductor device includes the semiconductor substrate 41, a lower layer 47 constituted by the lines 22 through 26 and an insulating pattern 42, an insulating layer 43 disposed on the lower layer 47, the contact plugs 27 through 29 which penetrate the insulating layer 43, and an upper layer 44 disposed on the insulating layer 43. Segments of the insulating pattern 42 and the lines 22 through 26 are alternately disposed across the substrate 41 in the second direction. Also, the contact plugs 27 through 29 and the lines 22 through 26 may be of the same or different materials.

The insulating layer 43 may comprise an oxide, a nitride, or an oxynitride. For example, the insulating layer 43 may comprise a silicon oxide, a silicon nitride, or a silicon oxynitride layer. Accordingly, the insulating layer 43 may be formed by rapid thermal oxidation (RTO), rapid thermal oxidation (RTO), chemical vapour deposition (CVD), plasma enhanced CVD (PECVD), high density plasma CVD (HDP-CVD), sputtering, or atomic layer deposition (ALD). The insulating layer 43 may also include a gate structure (not shown).

The contact plugs 27 through 29 can be formed by forming contact holes in the insulating layer 43 using a single photo/etch patterning technique, and then filling the contact holes with conductive material. More specifically, a photoresist layer is formed on the insulating layer 43. Then, the photoresist layer is patterned in such a manner that the photoresist layer has openings corresponding to the contact holes. Next, the insulating layer 43 is etched by using the patterned photoresist layer as an etch mask so that the contact holes are formed through the insulating layer 43. Then, the contact holes are overfilled with conductive material and the resulting structure is planarized, leaving the conductive material in the contact holes as the contact plugs 27 through 29. A cleaning process that may be performed after the insulating layer 43 is etched may impart an oval shape to the contact holes and hence to the contact plugs. However, a semiconductor device according to the inventive concept is not limited to any particular cross-sectional shape of the contact plugs. For example, the contact plugs may have a circular, oval, or polygonal cross section.

The contact plugs 27 through 29 may be of polysilicon, aluminum (Al), gold (Au), beryllium (Be), bismuth (Bi), cobalt (Co), copper (Cu), hafnium Hf), indium (In), manganese (Mn), molybdenum (Mo), nickel (Ni), lead (Pb), palladium (Pd), plutonium (Pt), rhodium (Rh), rhenium (Re), ruthenium (Ru), tantalium (Ta), tellurium (Te), titanium (Ti), tungsten (W), zinc (Zn), zirconium (Zr), or a combination of such materials. In the case of polysilicon, the polysilicon is doped with an n-type impurity or a p-type impurity. Alternatively, the contact plugs 27 through 29 may comprise a silicide or nitride, e.g., the contact plugs 27 through 29 may comprise titanium nitride (TiN), tungsten nitride (WN), tantalium nitride (TaN), titanium nitride silicon (TiSiN), tantalium silicon nitride (TaSiN), tungsten silicon nitride (WSiN), or a combination of such materials. Also, the contact plugs 27 through 29 may be formed as a composite layer including titanium/titanium nitride (Ti/TiN), tungsten/tungsten nitride (W/WN), or tantalium/tantalium nitride (Ta/TaN). In any case, a semiconductor device according to the inventive concept is not limited to contact plugs formed of the materials described above.

As illustrated in FIG. 3A, the contact plugs 27 through 29 are electrically connected to the upper layer 44 disposed on the insulating layer 43. The upper layer 44 may be constituted by an interlayer wiring layer, a peripheral circuit, or other electrically conductive components of the semiconductor device.

Referring to FIG. 3B, this embodiment of a semiconductor device according to the inventive concept includes the semiconductor substrate 41, a lower layer 45 disposed on the semiconductor substrate 41, an insulating layer 43 disposed on the lower layer 45, contact plugs 27 through 29 extending through the insulating layer 43, and an upper layer 48 formed of the lines 22 through 26 and an insulating pattern 46 segments of which are alternately disposed with the lines 22 through 26 across the insulating layer 43 in the second direction.

The lower layer 45 may include various types of electronic unit devices, e.g., active devices or passive devices, isolation layers that isolate the unit devices, conductive regions electrically connected to the unit devices, and/or conductive lines. An example of an active unit device is a transistor, such as that of a dynamic random access memory (DRAM), a static random access memory (SRAM), or a non-volatile memory device.

Each of the contact plugs 27 through 29 is electrically connected to a specific region of the lower layer 45. For example, in the case in which the lower layer 45 includes transistors of a non-volatile memory device, each of the contact plugs 27 through 29 may be a bit line contact plug connected to a source/drain region of a transistor of the non-volatile memory device.

As is also illustrated in FIG. 3B, the upper portions of the contact plugs 27 through 29 may be larger, i.e., may have larger cross-sectional areas, than the lower portions thereof due to the particular process used to manufacture the plugs. In this case, the process margin becomes especially important. The likelihood of an undesired electrical short between the line patterns 22 through 26 and the contact plugs 27 through 29 is minimized by providing the dummy portions (e.g., the dummy portions 31 through 34) according to the inventive concept.

The other aspects and characteristics of the embodiment illustrated in FIG. 3B are similar to those illustrated in and described above with reference to FIG. 3A.

Hereinafter, a method of manufacturing the semiconductor device of FIG. 3A will be described with reference to FIGS. 4A through 4K.

Figure 4A:
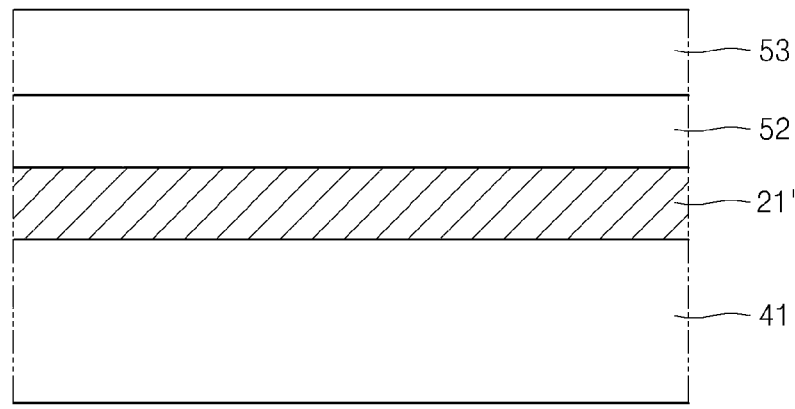
FIGS. 4A through 4K are horizontal cross-sectional and plan views that illustrate a method of manufacturing the semiconductor device of FIG. 2.

Referring to FIG. 4A, a first mask layer 53 is formed on the semiconductor substrate 41. The first mask layer 53 may be a photoresist layer or a hard mask layer comprising a silicon oxide, a silicon nitride, or a silicon oxynitride. For example, the first mask layer 53 may be a spin-on-hard mask (SOH) layer.

However, a layer 21', from which a line pattern is to be formed, may be formed on the semiconductor substrate 41 before the first mask layer 53. The layer 21' may be of conductive material for forming metal wiring having a line pattern. Alternatively, the layer 21' may be of material for use in forming a gate structure having, for example, a tunnelling insulating layer, a charge storing layer, a blocking insulating layer, and a gate electrode layer. In this case, the layer 21' may comprise a silicon oxide layer, a silicon nitride layer, a metal layer, or a combination of such materials. The layer 21' is omitted in the case in which line and isolation patterns corresponding to active regions and isolation regions are to be defined on the semiconductor substrate 41. In that case, the semiconductor substrate 41 is patterned.

Also, a second mask layer 52 may be formed on the semiconductor substrate 41 before the first mask layer 53. The second mask layer 52 may be a photoresist layer, or a hard mask layer comprising a silicon oxide, a silicon nitride, or a silicon oxynitride.

Figure 4B:
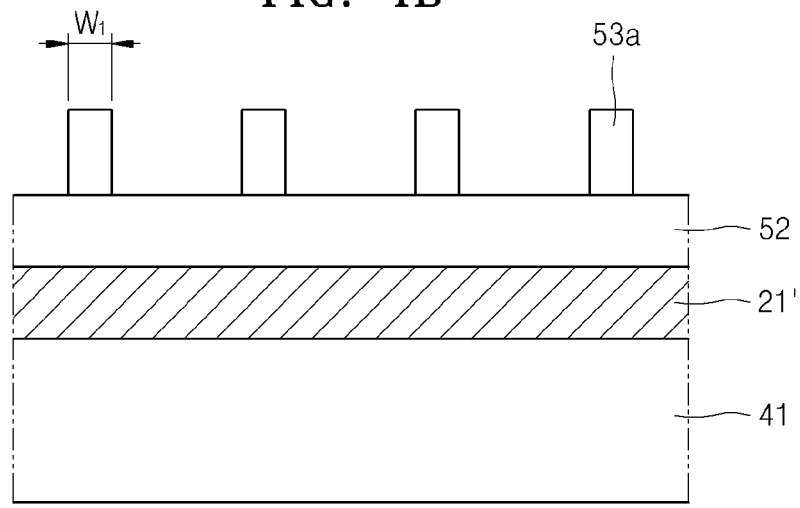
Figure 4C:
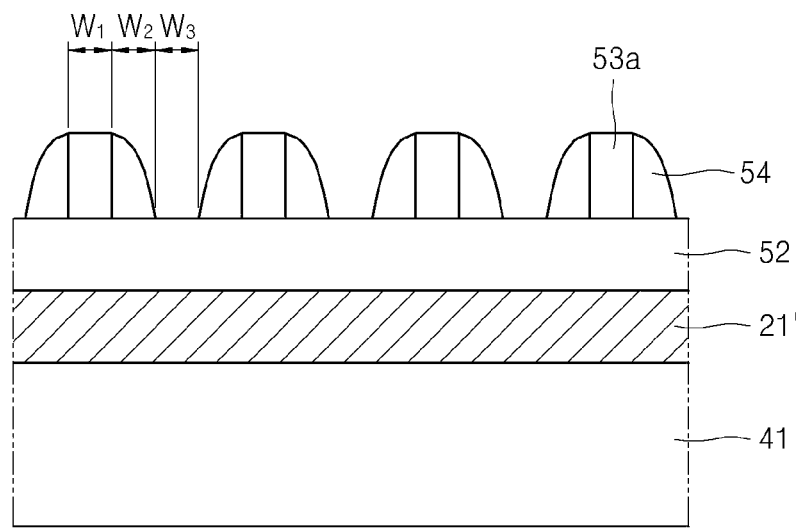

Referring to FIG. 4B, the first mask layer 53 is patterned to form a first mask 53a of (line) features each having a first width $W_1$. Referring to FIG. 4C, a respective spacer 54 is formed on both sides of each of the features of the first mask 53a. Each spacer 54 has a second width $W_2$, which is the dimension of the spacer as measured at either side of the feature of the first mask 53a to an exposed surface of the spacer in a direction parallel to the plane of the substrate 41. The spacers 54 can be formed by forming a layer of spacer material on the first mask pattern and then removing portions of the spacer material by anisotropically etching the layer of spacer material. At this time, the width $W_3$ of the space between adjacent spacers 54 may be equal to first width $W_1$. Also, the first width $W_1$ and/or the third width $W_3$ may be equal to the second width $W_2$. Preferably, the spacers 54 are formed of material having a high etch selectivity with respect to the first mask layer 53, and can be formed by ALD.

Figure 4D:
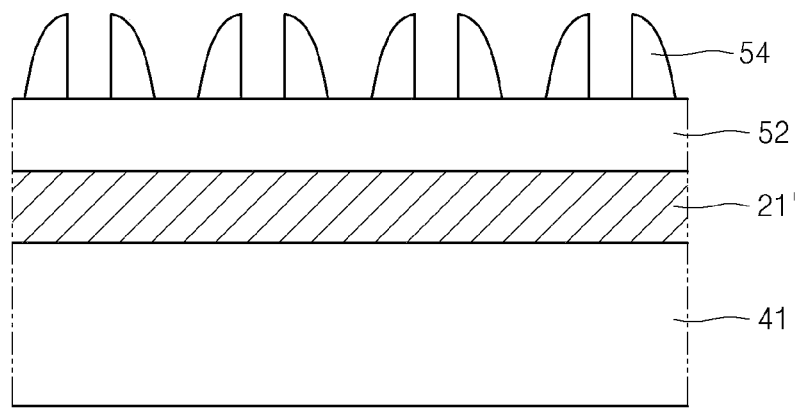

Referring to FIG. 4D, the first mask 53a is removed by an etching process. As a result, the spacers 54 remain on the substrate 41 as spaced apart from each other by a uniform distance.

Figure 4E:
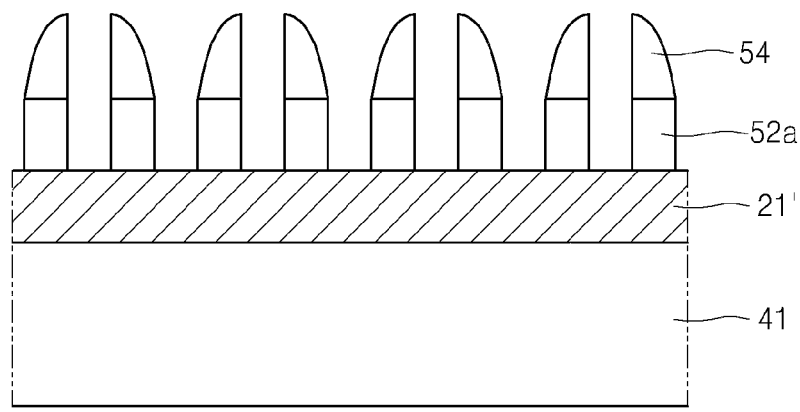

Referring to FIG. 4E, exposed portions of the second mask layer 52 are removed using the spacers 54 as an etch mask. Accordingly, a second mask 52a is formed under the spacers 54. The spacers 54 are removed in a subsequent process.

Figure 4F:
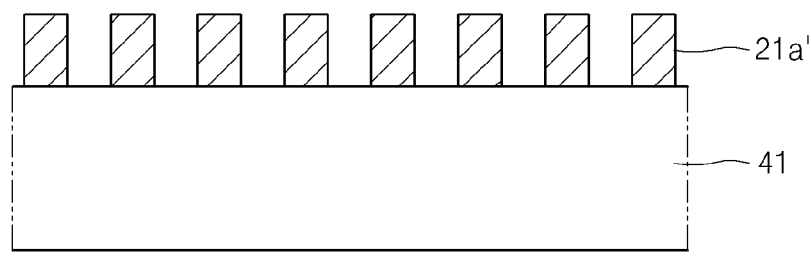

Referring to FIG. 4F, exposed portions of the layer 21' are removed using the second mask 52a as an etch mask. After that, the second mask 52a is removed. Accordingly, a material layer pattern 21a' is formed on the semiconductor substrate 41.

Figure 4G:
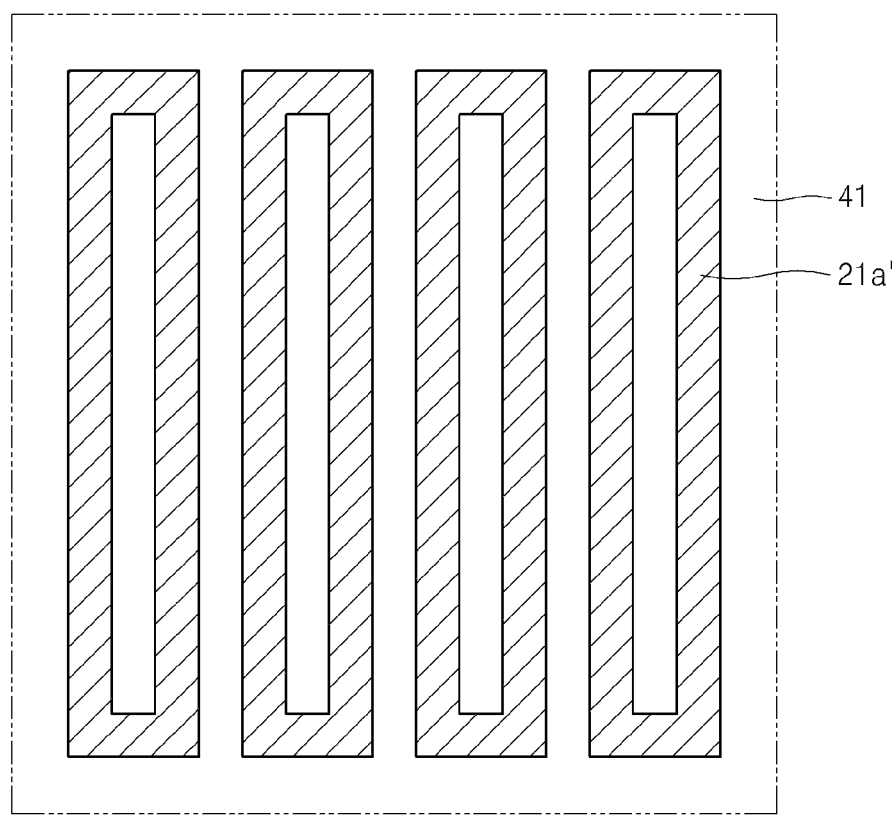

Referring to FIG. 4G, the material layer pattern 21a' is made up of a pattern of features each formed of a pair of lines that are connected to each other at both ends. This is because the spacers 54 extended not only along the sides of each of the (line) features of the first mask 53a as described above but also along both ends of each of the (line) features of the first mask 53a.

Figure 4H:
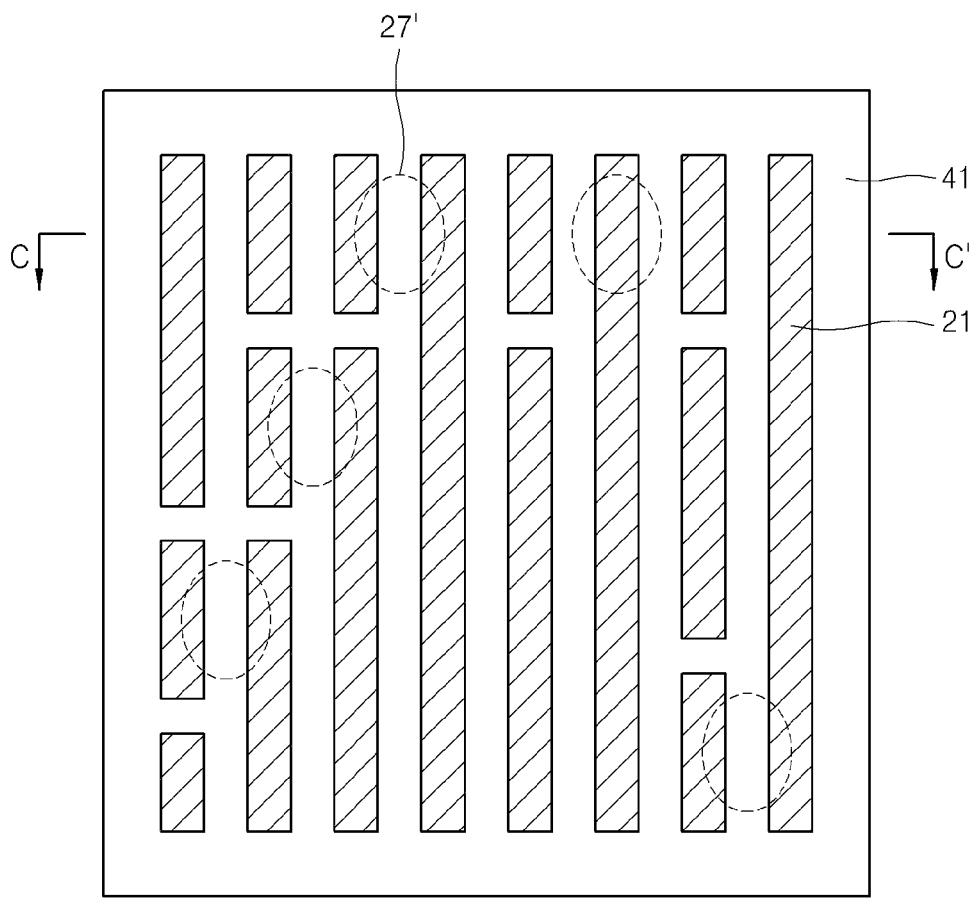

Referring to FIG. 4H, the line pattern 21 is formed on the semiconductor substrate 41 from the material layer pattern 21a'. More specifically, the material layer pattern 21a' is divided into a set of unconnected lines removing the ends of each feature of the material layer pattern 21a' which connect a pair of the lines constituting the feature. The ends can be removed by an etching process using a third mask (not shown) as an etch mask. At this time and using the same process, the separated dummy portions and connecting portions of the line pattern may be formed by dividing respective ones of the lines constituting the features of the material layer line pattern 21a'. The dummy portions are disposed adjacent regions 27' (indicated by the dotted line) at which contact plugs will be formed.

Figure 4I:
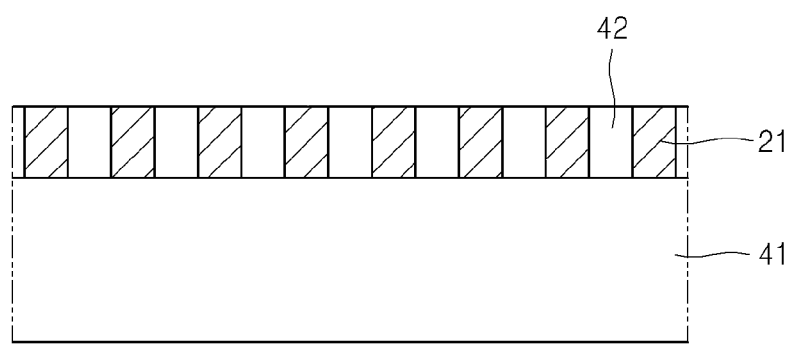

As illustrated in FIG. 4I, an insulating pattern 42 is formed between the lines of the line pattern 21. To this end, insulating material is deposited on the semiconductor substrate 41 over the line pattern 21, and then a planarizing process is performed until the line pattern 21 is exposed.

Figure 4J:
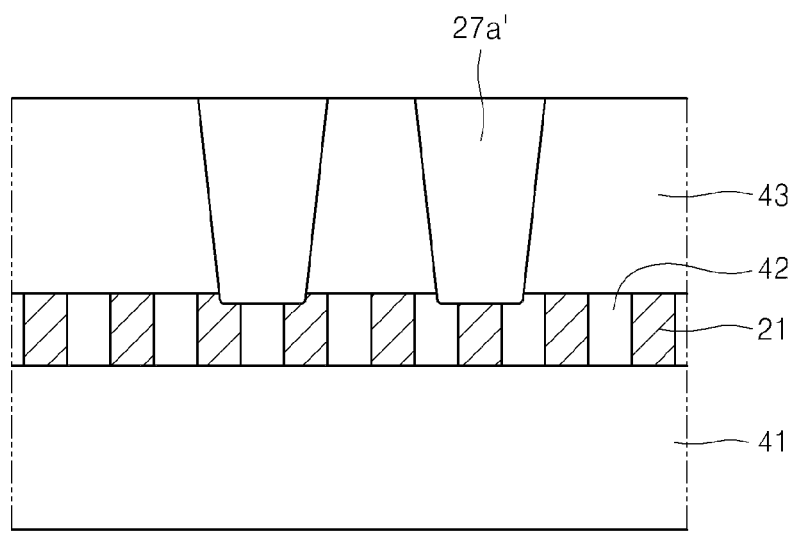

Referring to FIG. 4J, the insulating layer 43 is then formed on the semiconductor substrate 41. After that, the insulating layer 43 is etched using a fourth mask (not shown) as an etch mask to thereby form contact holes 27a' extending through the insulating layer 43. At this time, it is not possible to discern the exact location of the line pattern 21. Thus, a sufficient process margin is important for the process of aligning the contact holes 27a' with the line pattern 21. Also, only one photolithography process is used to form the contact holes 27a'. Therefore, the diameter of each of the contact holes 27a' may be greater than the width of each line of the line pattern 21 formed using the above-described double patterning technique.

Figure 4K:
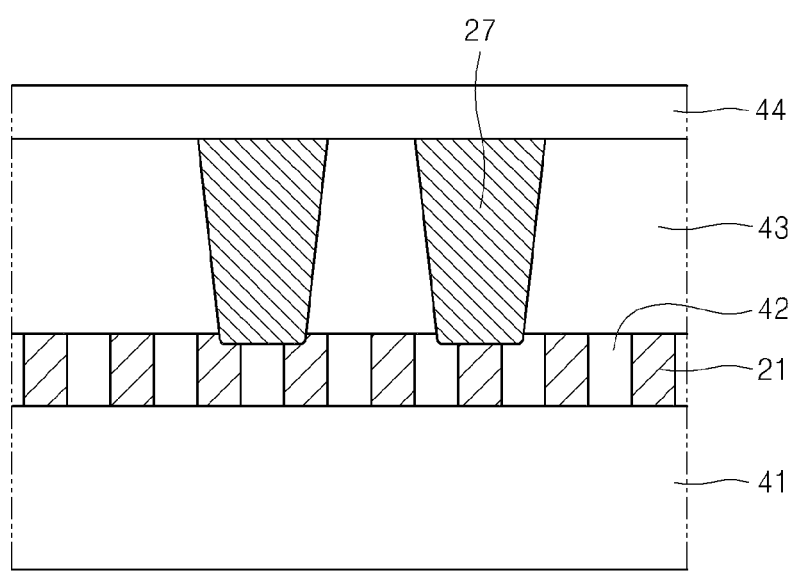

Referring to FIG. 4K, contact plugs 27 are formed by filling the contact holes 27a' with conductive material. then, the upper layer 44 may be formed. The upper layer 44 may be an interlayer wiring layer for connecting the contact plugs 27 to an external circuit.

A semiconductor device according to the inventive concept may be manufactured by methods different from that described above with reference to FIGS. 4A through 4K. For example, depending on the line width of the line pattern, the line pattern 21 may be formed by a single etching process using a mask having a pattern corresponding to that of the line pattern 21.

Memory devices employing a line pattern 21 and contact plugs 27 through 29 of the types described above will now be described in detail.

Figure 5:
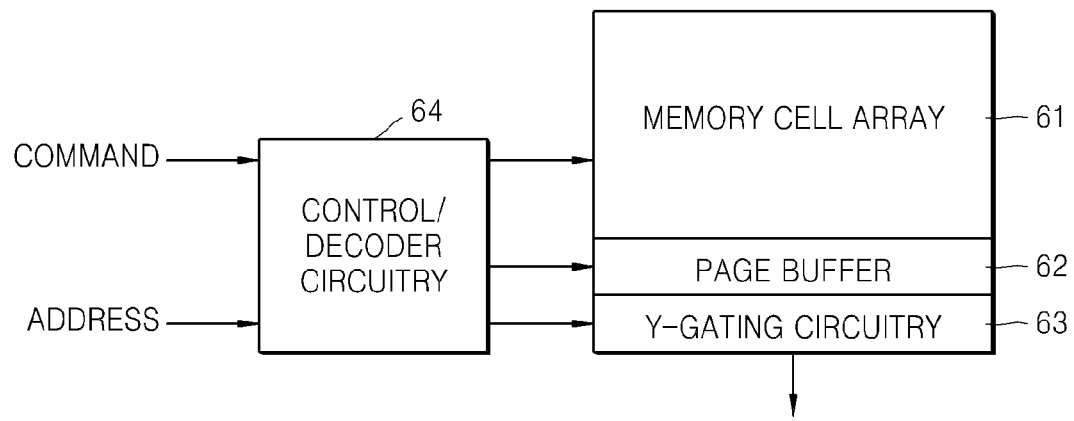
FIG. 5 is a block diagram of a non-volatile memory of a type which can employ a semiconductor device according to the inventive concept.

FIG. 5 is a block diagram of an embodiment of a non-volatile memory in which line patterns and contact plugs are connected, according to the inventive concept.

The non-volatile memory includes a memory cell array 61, a page buffer 62, a Y-gating circuit 63, and a control/decoder circuit 64.

The memory cell array 61 includes a plurality of memory blocks, and each of the memory blocks includes a plurality of non-volatile memory cells. The non-volatile memory cells may be flash memory cells, NAND flash memory cells, or charge trap flash memory cells. The page buffer 62 temporarily stores data to be written to the memory cell array 61 or data that is read from the memory cell array 61. The Y-gating circuit 63 transmits data stored in the page buffer 62. The control/decoder circuit 64 receives a command (CMD) and an address from an external source (not shown), outputs a control signal for writing data to the memory cell array 61 or reading data from the memory cell array 61, and decodes the address. The control/decoder circuit 64 outputs to the page buffer 62 a control signal for data input and output, and provides an address signal including address information to the Y-gating circuit 63.

Figure 6:
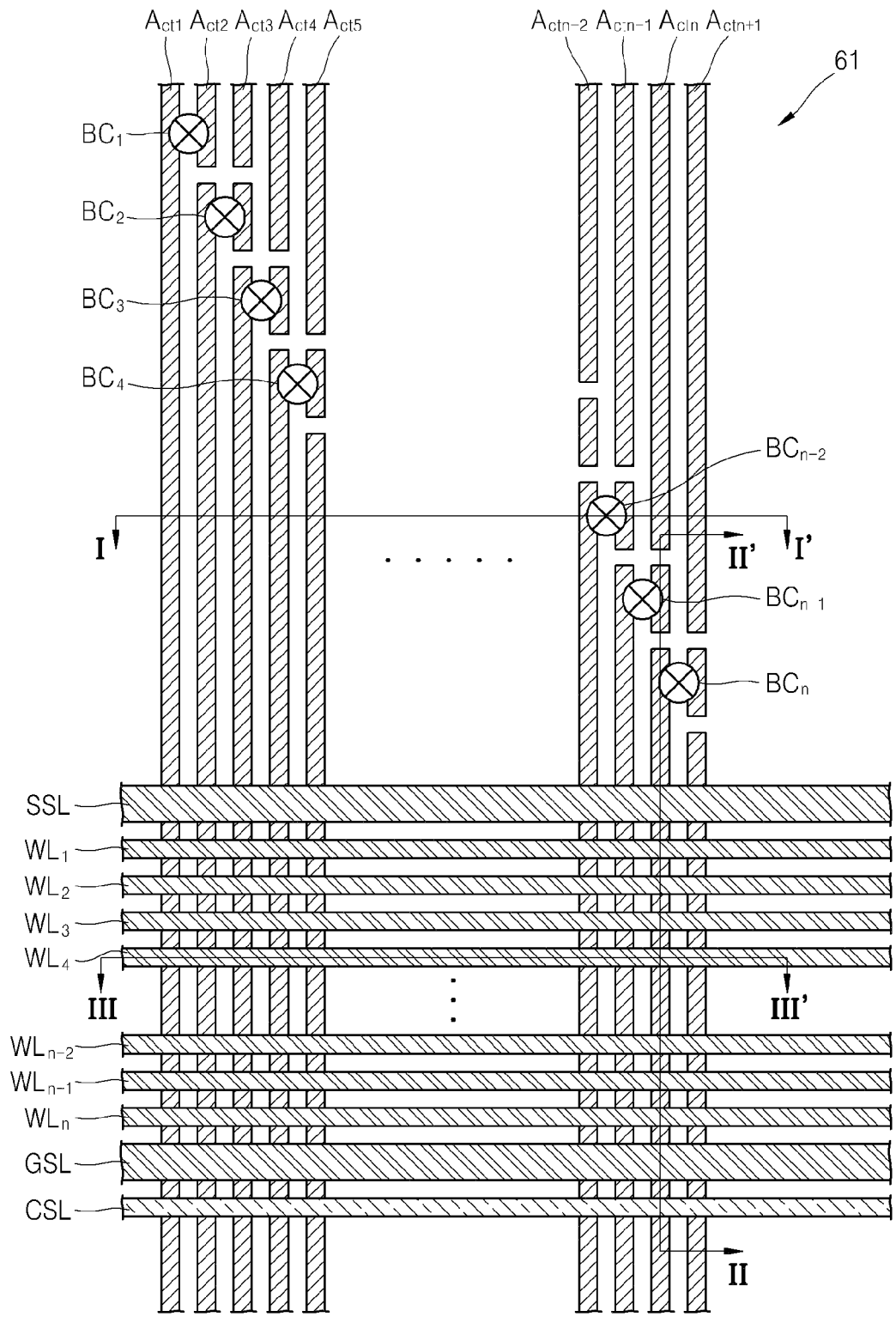
Figure 7:
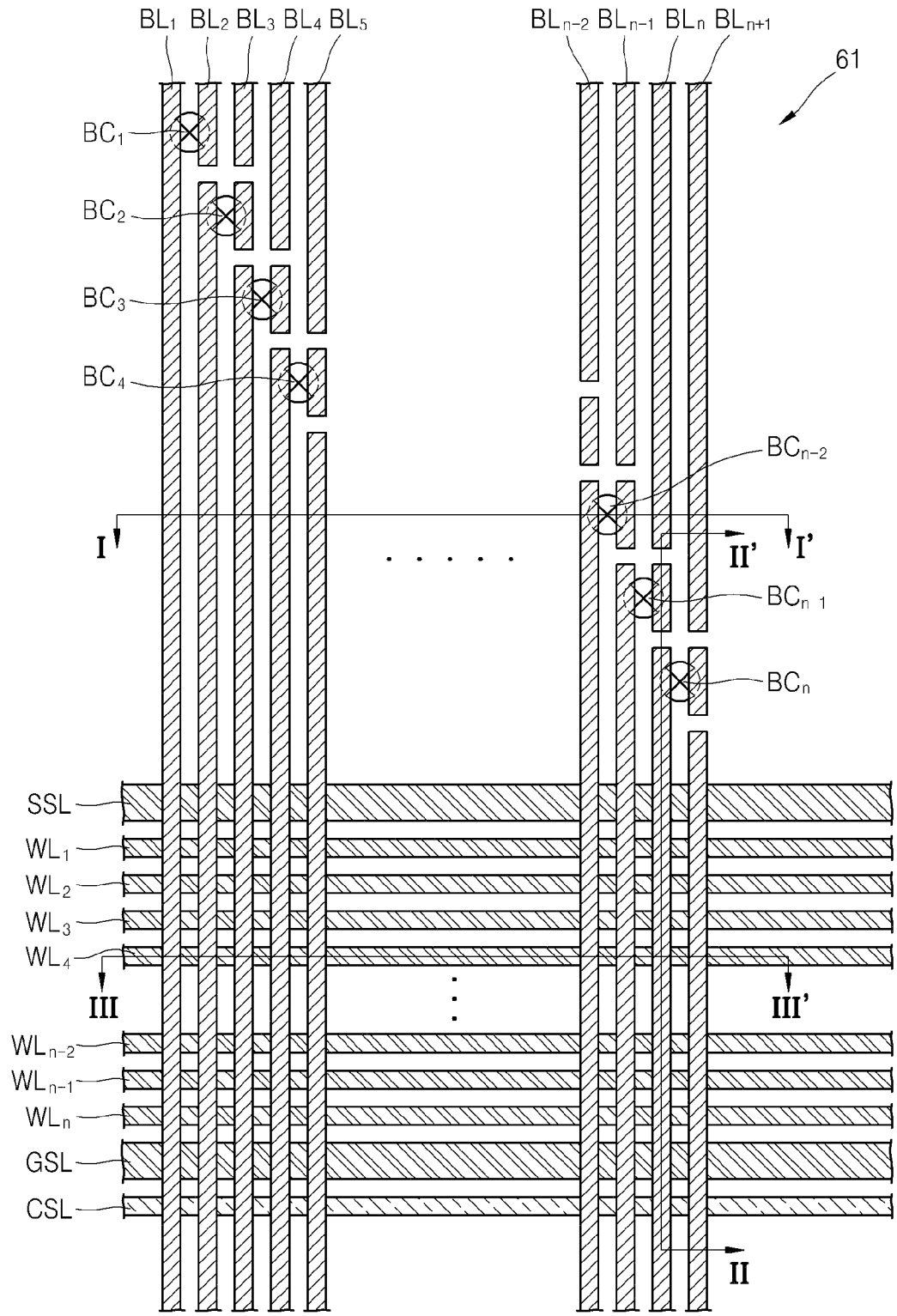
Figure 8:
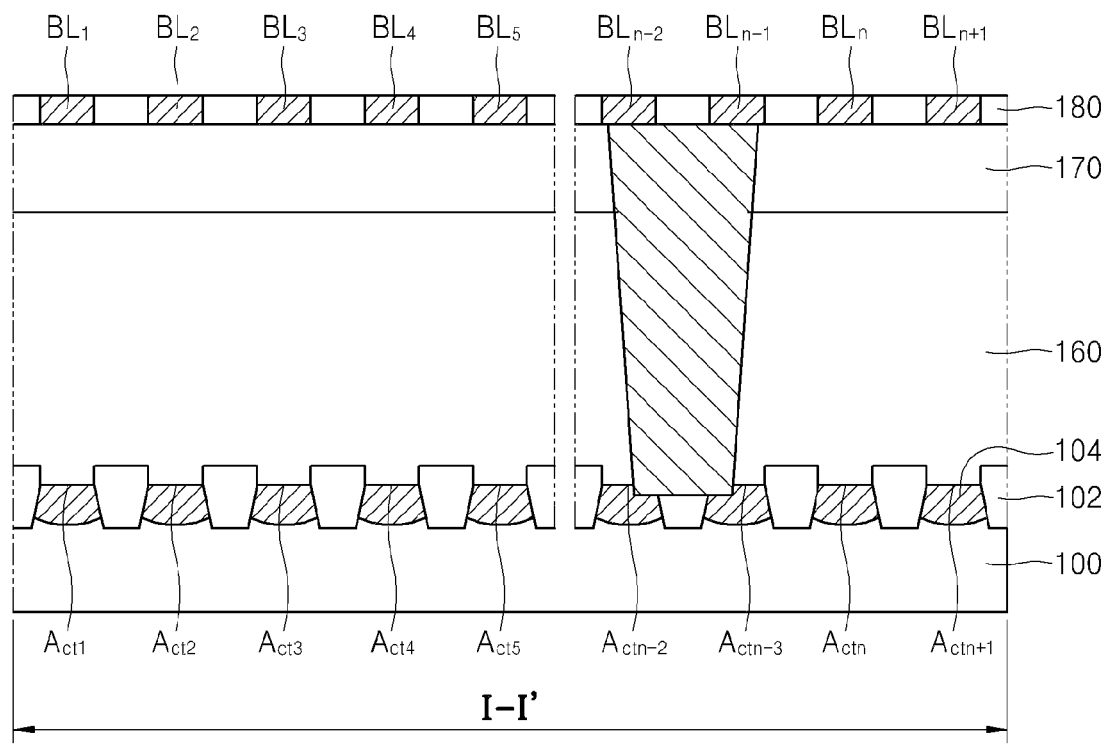
FIGS. 8 through 10 are cross-sectional views taken along lines I-I', II-II', and III-III' of FIGS. 6 and 7, respectively.
Figure 9:
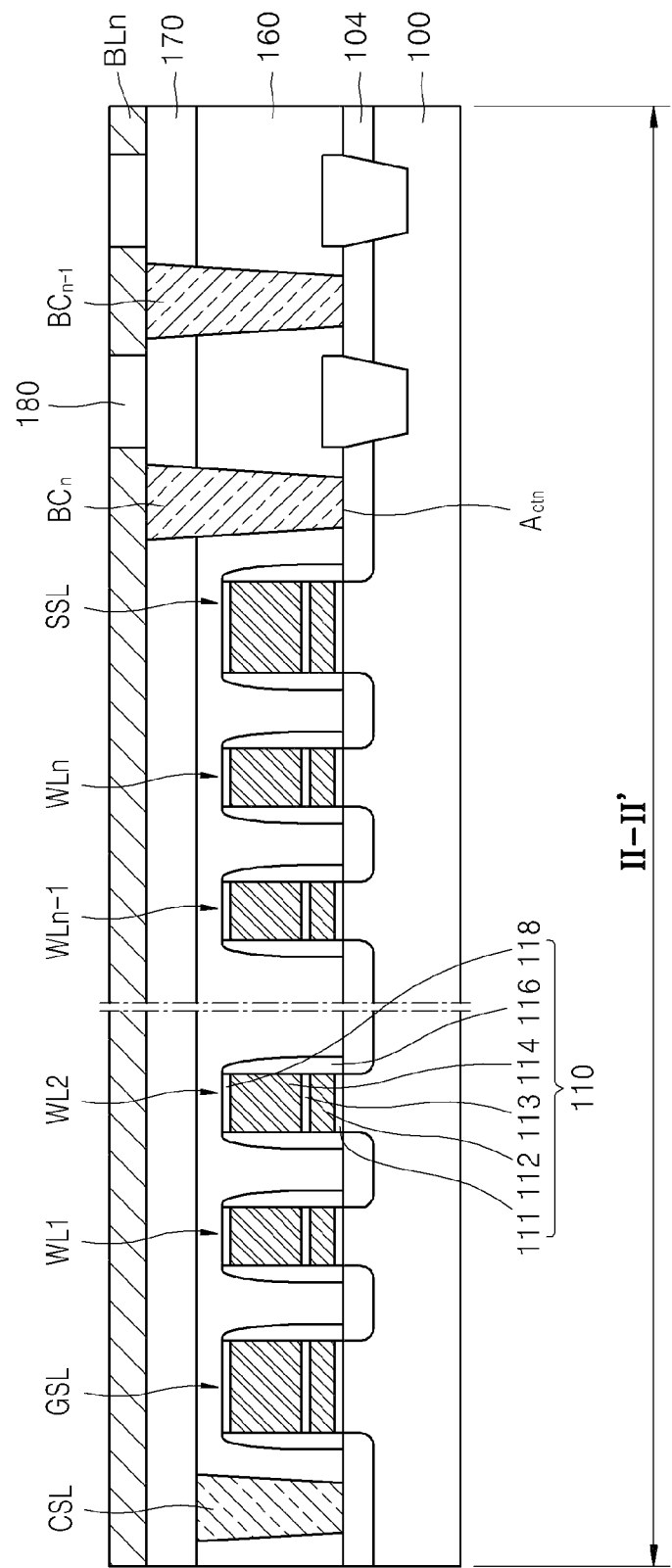
Figure 10:
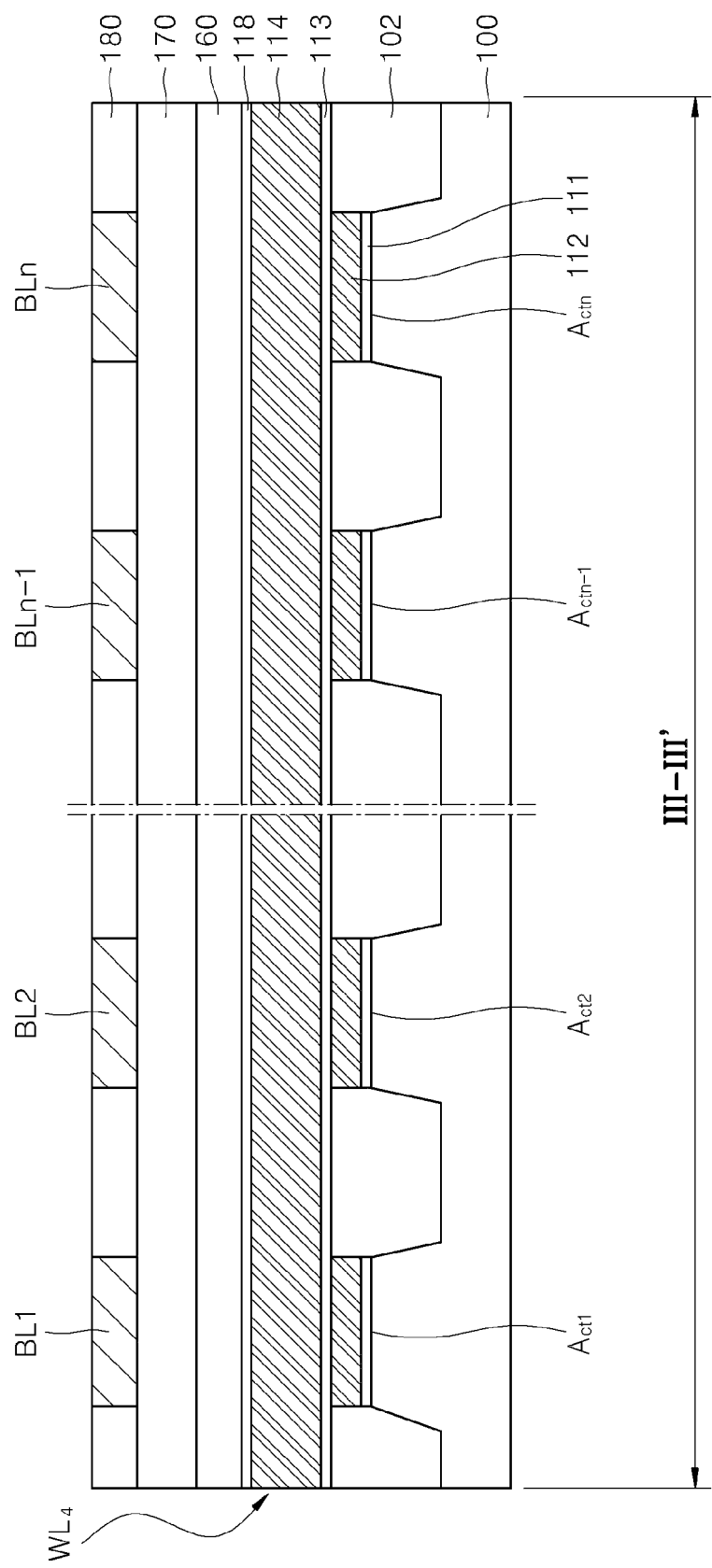

FIGS. 6 and 7 are layout diagrams of portions of the memory cell array 61 of the non-volatile memory of FIG. 5. More specifically, FIG. 6 illustrates an example of the connection between active regions on which memory cells are formed and bit line contact plugs. FIG. 7 illustrates an example of the connection between bit line contact plugs of a memory cell string and bit lines. These structures shown in FIGS. 6 and 7 may be employed independently from each other or may be employed in combination in the memory cell array. FIGS. 8 through 10 are cross-sectional views of an example in which the structures shown in FIGS. 6 and 7 are used in combination.

Referring to FIGS. 6 through 10, the memory cell array 61 may include a plurality of active regions $Act_1$ through $Act_n$ that are defined by isolation regions 102 in a semiconductor layer 100. The active regions $Act_1$ through $Act_n$ are respectively and electrically connected to bit line contact plugs $BC_1$ through $BC_n$, and dummy portions of active regions $Act_2$ through $Act_{n+1}$ are disposed adjacent to locations at which the active regions $Act_1$ through $Act_n$ are respectively and electrically connected to the bit line contact plugs $BC_1$ through $BC_n$. The bit line contact plugs $BC_1$ through $BC_n$ may be electrically connected to the dummy portions of active regions $Act_2$ through $Act_{n+1}$ due to an alignment error in the process of manufacturing the contact holes in which the bit line contact plugs $BC_1$ through $BC_n$ are formed.

A string selection line (SSL) and a ground selection line (GSL) extend across over the active regions $Act_1$ through $Act_n$. A plurality of word lines $WL_1$ through $WL_n$ extend across and over the active regions $Act_1$ through $Act_n$ between the SSL and the GSL. The SSL, the GSL, and the word lines $WL_1$ through $WL_n$ may be parallel to each other. A plurality of impurity regions 104 are formed in the active regions $Act_1$ through $Act_n$ adjacent the sides of the word lines $WL_1$ through $WL_n$, SSL, and GSL.

The structure described above thus constitutes a string selection transistor, cell transistors, and a ground selection transistor, which are serially connected. The string selection transistor, the ground selection transistor, and the cell transistors that are disposed between the string selection transistor and the ground selection transistor form a unit memory block. The impurity region 104 that is adjacent to the SSL and is remote from the GSL may serve as a drain region of the string selection transistor. On the other hand, the impurity region 104 that is adjacent to the GSL and is remote from the SSL may serve as a source region of the ground selection transistor.

Each of the word lines $WL_1$ through $WL_n$ may include a tunneling insulating layer 111, a charge storing layer 112, a blocking insulating layer 113, and a cell gate electrode 114 which are sequentially stacked on the semiconductor layer 100. Although not illustrated in the drawings, each of the word lines $WL_1$ through $WL_n$ may further include a barrier conductive layer and/or a word line conductive layer on the cell gate electrode 114.

Each of the tunneling insulating layers 111 and the charge storing layers 112 may be separated into portions with respect to the cell transistors that are adjacent in the longitudinal direction of the word lines $WL_1$ through $WL_n$. In this case, the upper surface of the isolation region 102 may be substantially coplanar with the upper surface of the charge storing layer 112. The tunneling insulating layer 111 may be a silicon oxide layer. The charge storing layer 112 may be a charge trapping layer or a floating gate conductive layer. Meanwhile, the blocking insulating layer 113 may be shared among the cell transistors that are adjacent in the longitudinal direction of the word lines $WL_1$ through $WL_n$. A cell spacer 116 is disposed on each of contiguous side walls of the tunneling insulating layer 111, the charge storing layer 112, the blocking insulating layer 113, and the cell gate electrode 114. The cell spacer 116 may be a multi-layered structure.

Each of the SSL and the GSL may have a stacked structure similar to the stacked structure of each of the word lines $WL_1$ through $WL_n$. In general, though, the width of each of the SSL and the GSL will be greater than that of each of the word lines $WL_1$ through $WL_n$.

A first interlayer dielectric layer 160 covers the word lines $WL_1$ through $WL_n$, the SSL and the GSL. A common source line (CSL) extending through the first interlayer dielectric layer 160 is connected to the source region of the GSL. The CSL may extend parallel to the GSL. A second interlayer dielectric layer 170 may be provided on the first interlayer dielectric layer 160. In this case, each of the bit line contact plugs $BC_1$ through $BC_n$ extend through the second interlayer dielectric layer 170 and the first interlayer dielectric layer 160 to the drain region of the SSL. In this respect, the bit line contact plugs $BC_1$ through $BC_n$ are respectively electrically connected to portions of the active regions $Act_1$ through $Act_n$ connected to the SSL but one or more of the bit line contact plugs $BC_1$ through $BC_n$ may be electrically connected to a dummy portion of an adjacent one of the active regions $Act_2$ through $Act_{n+1}$. This can occur if an alignment error occurs in the process of forming the bit line contact plugs $BC_1$ through $BC_n$.

Bit lines $BL_1$ through $BL_n$ are disposed on the second interlayer dielectric layer 170. The bit lines $BL_1$ through $BL_n$ are connected to the bit line contact plugs $BC_1$ through $BC_n$ while crossing above the word lines $WL_1$ through $WL_n$.

The bit lines $BL_1$ through $BL_n$ are respectively and electrically connected to the bit line contact plugs $BC_1$ through $BC_n$. An insulating layer 180 occupies the regions between the bit lines $BL_2$ through $BL_{n+1}$ to electrically insulate the bit lines $BL_2$ through $BL_{n+1}$ from each other. Dummy portions, as parts of bit lines $BL_2$ through $BL_{n+1}$ are formed adjacent the locations at which the bit lines $BL_1$ through $BL_n$ are respectively and electrically connected to the bit line contact plugs $BC_1$ through $BC_n$. One or more of the bit line contact plugs $BC_1$ through $BC_n$ may be electrically connected to the dummy portions of the bit lines $BL_2$ through $BL_{n+1}$. This can occur if an alignment error occurs in the process of forming the bit lines $BL_2$ through $BL_{n+1}$.

As illustrated in FIGS. 6 and 7, the bit lines $BL_1$ through $BL_n$ are disposed in parallel with the active regions $Act_1$ through $Act_n$. However, the inventive concept is not so limited as it is not necessary to dispose the bit lines $BL_1$ through $BL_n$ so as to be in parallel with the active regions $Act_1$ through $Act_n$.

Figure 11:
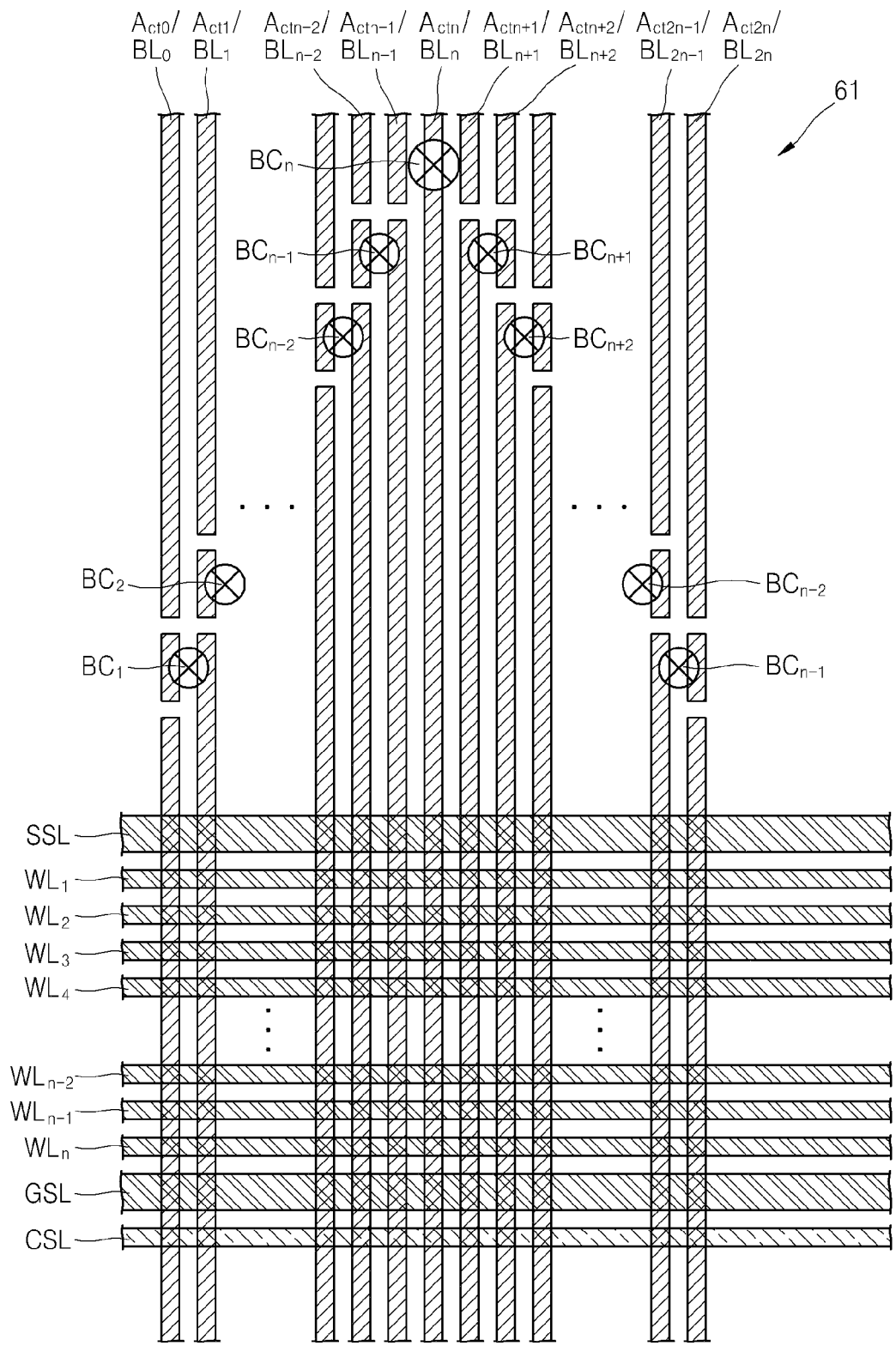
FIGS. 11 and 12 are layout diagrams of other embodiments of memory cell arrays, according to the inventive concept, employed by a non-volatile memory of the type depicted by FIG. 5.
Figure 12:
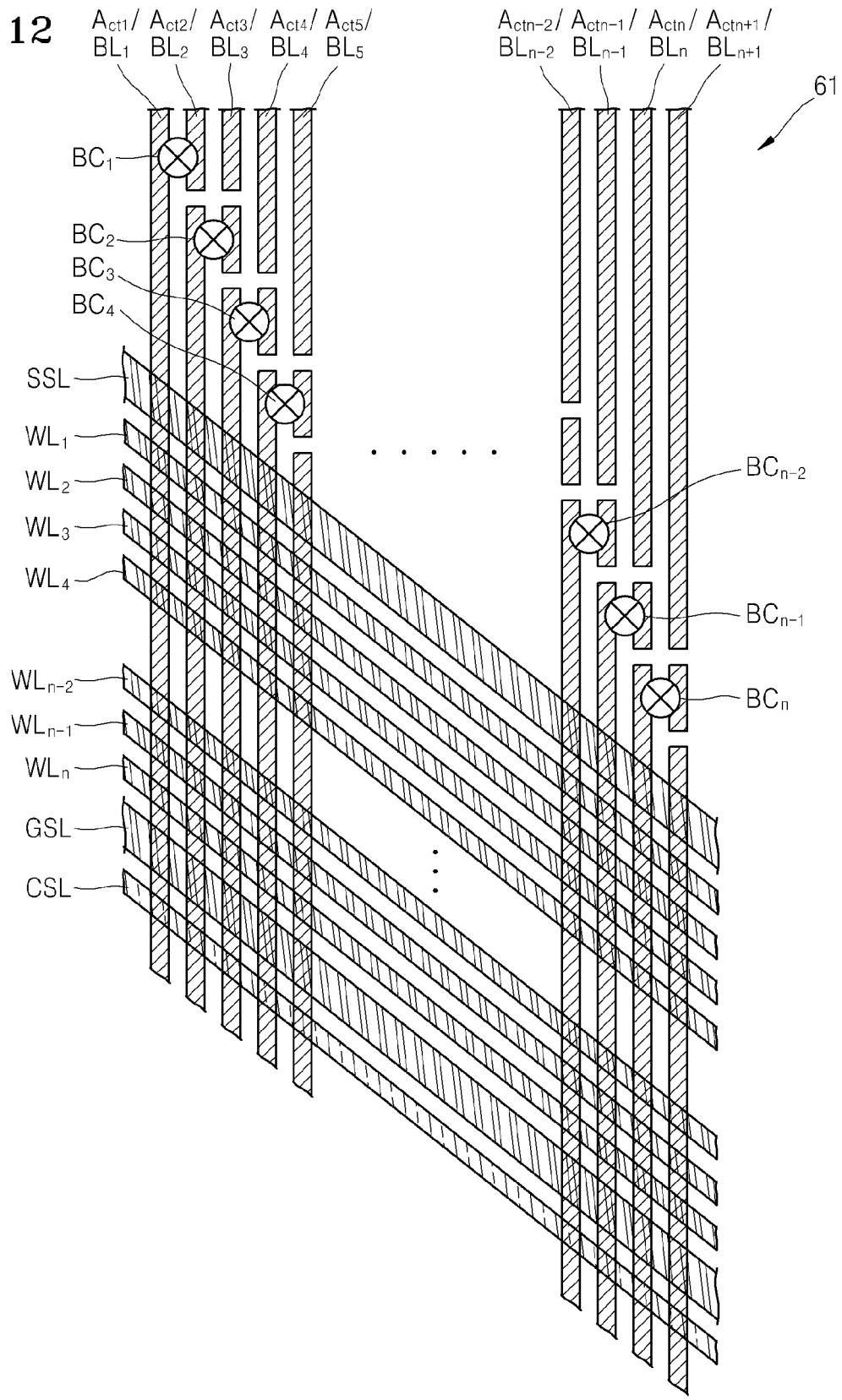

FIGS. 11 and 12 are layout diagrams of portions of memory cell arrays 61 of other embodiments of a non-volatile memory of the type illustrated in FIG. 5, according to the inventive concept. In particular, each of FIGS. 11 and 12 illustrates an example of active regions or bit lines and bit line contact plugs that are connected to the active regions or bit lines.

Referring to FIG. 11, an active region $Act_{n-1}$ or bit line $BL_{n-1}$ and an active region $Act_{n+1}$ or bit line $BL_{n+1}$ have respective dummy portions adjacent the opposite sides of the location at which an active region $Act_n$ or bit line $BL_n$ is connected to a bit line contact plug $BC_n$. Also, active regions $Act_0$ through $Act_{n-2}$ or bit lines $BL_0$ through $BL_{n-2}$ have dummy portions adjacent one side only of active regions $Act_1$ through $Act_{n-1}$ or bit lines $BL_1$ through $BL_{n-1}$. Therefore, the active regions $Act_1$ through $Act_{n-1}$ or bit lines $BL_1$ through $BL_{n-1}$ may be reliably connected to bit line contact plugs $BC_1$ through $BC_{n-1}$ without creating short circuits, i.e., a sufficiently large process margin is secured.

Referring to FIG. 12, an SSL that crosses an active region $Act_n$ or bit line $BL_n$, word lines $WL_1$ through $WL_n$, a GSL, and a CSL may extend longitudinally in a direction that is oblique with respect to the longitudinal direction of the active region $Act_n$ or bit line $BL_n$ to which the bit line contact plugs $BC_1$ through $BC_n$ are electrically connected. This layout allows for the memory device to be manufactured with a comparatively high degree of integration.

Figure 13:
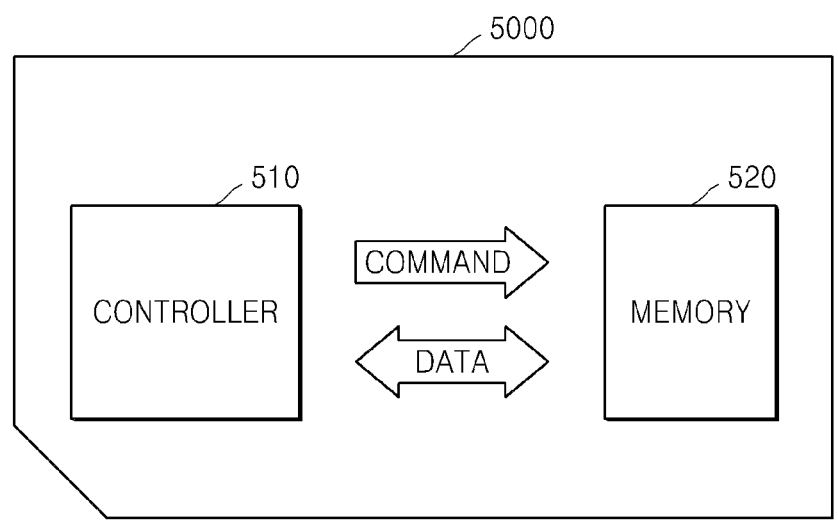
FIG. 13 is a schematic diagram of a type of a card that may employ a semiconductor device according to the inventive concept.

FIG. 13 is a schematic diagram of a card 5000 in accordance with the inventive concept.

Referring to FIG. 13, the card 5000 has a controller 510 and a memory 520 which exchange electrical signals. For example, the controller 510 may send a command to the memory 520, which causes the memory 520 to transmit data back to the controller 510. The memory 520 may include one or more of the non-volatile memories described above according to the inventive concept. As is clear from the foregoing description, the non-volatile memories employing the inventive concept may comprise "NAND" and "NOR" architecture memory arrays in correspondence with related logic gate designs. In this type of architecture, a memory array formed of a plurality of columns and rows of memory cells forms a memory array bank. The memory 520 may include one such memory array or at least one such memory array bank. Also, the card 5000 may further include a column decoder (not shown), a row decoder (not shown), input/output (I/O) buffers (not shown), and/or a control register (not shown) so as to drive the memory array bank (not shown). The card 5000 may thus be embodied as a memory stick card, a smart media (SM) card, a secure digital (SD) card, a mini SD card, a multimedia card (MMC), or the like.

Figure 14:
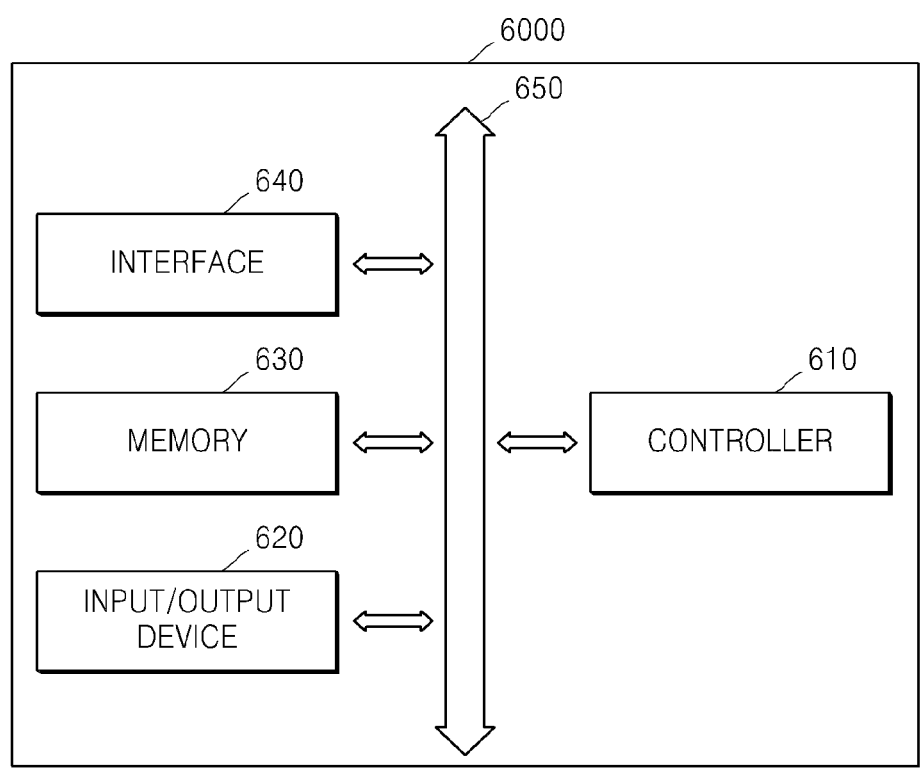
FIG. 14 is a schematic diagram of a type of an electronic system of a type that may employ a semiconductor device according to the inventive concept.

FIG. 14 is a block diagram of an embodiment of an electronic system 6000 employing a semiconductor device according to the inventive concept.

Referring to FIG. 14, the system 6000 includes a controller 610, an I/O device 620, a memory 630, and an interface 640. The system 6000 may be a mobile system or a system for transmitting or receiving information. Examples of such a mobile system include personal digital assistants (PDA), portable computers, web tablets, cordless phones, mobile phones, digital music players, and memory cards. The controller 610 may function to execute a program and control the system 6000.

The controller 610 may be a microprocessor, a digital signal processor, a microcontroller or the like. The I/O device 620 is used to input or output data to or from the system 6000. The system 6000 may be connected by the I/O device 620 to an external device such as a personal computer (PC) or a network, such that the system 6000 can exchange data with the external device. To this end, the I/O device 620 may be a keypad, a keyboard, or a display. The memory 630 store codes and/or data for the controller 610, and/or may store data that is processed by the controller 610. The memory 630 includes one or more of the non-volatile memory devices according to the inventive concept. The interface 640 forms a data transmission path between the system 6000 and the external device. The controller 610, the I/O device 620, the memory 630, and the interface 640 communicate with each other via a bus 650. As is clear from the foregoing description, the electronic system 6000 may be used in a mobile phone, an MPEG-1 Audio Layer 3 (MP3) player, a navigation device, a portable multimedia player (PMP), a solid state disk (SSD), or a household appliance.

Finally, embodiments of the inventive concept have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiments described above but by the following claims.

What is claimed is:

1. A semiconductor device comprising:
a line pattern including a parallel arrangement of lines extending longitudinally in a first direction, the arrangement of lines including a first line, and a second line adjacent to a first side of the first line in a second direction, wherein each one of the first and second lines respectively includes along its length in the first direction a connecting portion and a dummy portion electrically isolated from the connecting portion; and
a contact plug electrically connected to the connecting portion of the first line at a contact plug point,
wherein the contact plug point is laterally adjacent to the dummy portion of the second line,
wherein the contact plug is also electrically connected to the dummy portion of the second line at the contact plug point, and
wherein the contact plug has a portion directly contacting the connecting portion of the first line, and another portion directly contacting the dummy portion of the second line.

2. The semiconductor device of claim 1, wherein a central axis of the contact plug is laterally offset in the second direction from a longitudinal center line of the first line towards the second line.

3. The semiconductor device of claim 2, wherein the central axis of the contact plug extends in a third direction orthogonal to the first and second directions.

4. The semiconductor device of claim 1, wherein a diameter of the contact plug is greater than a width of the first line in the second direction.

5. The semiconductor device of claim 1, wherein for each line in the parallel arrangement of lines, a width of the connecting portion is equal to a width of the dummy portion.

6. The semiconductor device of claim 1, wherein each line in the parallel arrangement of lines is respectively formed by an active semiconductor region.

7. A semiconductor device comprising:
a lower layer having a plurality of linear active regions and a plurality of linear isolation regions, wherein the plurality of active regions and the plurality of isolation regions each extend longitudinally in a first direction, and the active regions are alternately disposed with the isolation regions across a semiconductor substrate; and
an insulating layer disposed on the lower layer; and
contact plugs each extending through the insulating layer, wherein the plurality of active regions include a first active region, and a second active region that is spaced from the first active region in a second direction and comprises a dummy portion and a connecting portion which are electrically insulated from each other and have the same width, and
wherein the plurality of contact plugs include a first contact plug adjacent the dummy portion of the second active region and electrically connected to the first active region, and a second contact plug electrically connected to the connecting portion of the second active region.

8. A semiconductor device comprising:
a semiconductor substrate;
a plurality of memory transistors disposed at an upper portion of the substrate;
an insulating layer disposed on the semiconductor substrate;
a plurality of contact plugs each extending through the insulating layer; and
a wiring layer comprising a line pattern of a plurality of linear conductive lines and an insulating pattern of a plurality of linear segments of insulating material, wherein the conductive lines of the line pattern and the segments of the insulating pattern each extend longitudinally in a first direction, and the conductive lines are alternately disposed in a second direction across the substrate with the segments of the insulating pattern,
wherein the linear conductive lines of the line pattern include a first line, and a second line that is separated from the first line and comprises a dummy portion and a connecting portion which are electrically insulated from each other and have the same width, and
the plurality of contact plugs include a first contact plug adjacent to the dummy portion of the second line and electrically connected to the first line, and a second contact plug electrically connected to the connecting portion of the second line.

9. The semiconductor device of claim 1, wherein each line in the parallel arrangement of lines is respectively formed by a wiring layer.

10. The semiconductor device of claim 1, wherein the semiconductor device is a semiconductor memory device, and each line in the parallel arrangement of lines is a bit line in a plurality of bit lines.

11. The semiconductor device of claim 10, wherein the semiconductor device comprises a memory cell array wherein a plurality of word lines intersect the plurality of bit lines, and the contact plug point is disposed outside the memory cell array.

12. The semiconductor device of claim 1, wherein the arrangement of lines further including a third line adjacent to a second side of the first line opposite to the first side in the second direction, wherein the third line includes along its length in the first direction a connecting portion and a dummy portion electrically isolated from the connecting portion, and wherein the contact plug point is laterally adjacent to the dummy portion of the second line and the dummy portion of the third line.

* * * * *